United States Patent [19]

Iwamoto et al.

[11] Patent Number: 5,844,859
[45] Date of Patent: Dec. 1, 1998

[54] SYNCHRONOUS SEMICONDUCTOR MEMORY DEVICE RELIABLY FETCHING EXTERNAL SIGNAL IN SYNCHRONIZATION WITH CLOCK SIGNAL PERIODICALLY SUPPLIED FROM THE EXTERIOR

[75] Inventors: Hisashi Iwamoto; Yasuhiro Konishi, both of Tokyo, Japan

[73] Assignee: Mitsubishi Denki Kabushiki Kaisha, Tokyo, Japan

[21] Appl. No.: 923,689

[22] Filed: Sep. 4, 1997

[30] Foreign Application Priority Data

Apr. 9, 1997 [JP] Japan .................................. 9-090787

[51] Int. Cl.[6] ...................................................... G11C 8/00
[52] U.S. Cl. ............... 365/233; 365/230.03; 365/230.06; 365/233.5
[58] Field of Search ................................. 365/233, 233.5, 365/230.03, 203, 230.06, 230.08

[56] References Cited

U.S. PATENT DOCUMENTS 5,404,338  4/1995  Murai et al. ............................. 365/233
5,517,462  5/1996  Iwamoto et al. ......................... 365/233
5,546,355  8/1996  Raatz et al. ............................. 365/233
5,691,955  11/1997 Yamauchi ................................ 365/233
5,764,584  6/1998  Fukiage et al. ...................... 365/230.03

*Primary Examiner*—David Nelms
*Assistant Examiner*—Hien Nguyen
*Attorney, Agent, or Firm*—Oblon, Spivak, McClelland, Maier & Neustadt, P.C.

[57] ABSTRACT

When an operating frequency is increased and a CAS latency is set longer, a data write end time is delayed by a specific time in response to the change of the CAS latency. The specific time is greater than a period corresponding to the CAS latency. The specific time may be the minimum time necessary for writing second-bit data. The write margin can also be enlarged by delaying the write timing (activation and inactivation) in the interior of a memory itself by one clock cycle of an external clock signal. Thus, a write period for second-bit data is ensured in an SDRAM, even if the operation frequency is increased.

15 Claims, 26 Drawing Sheets

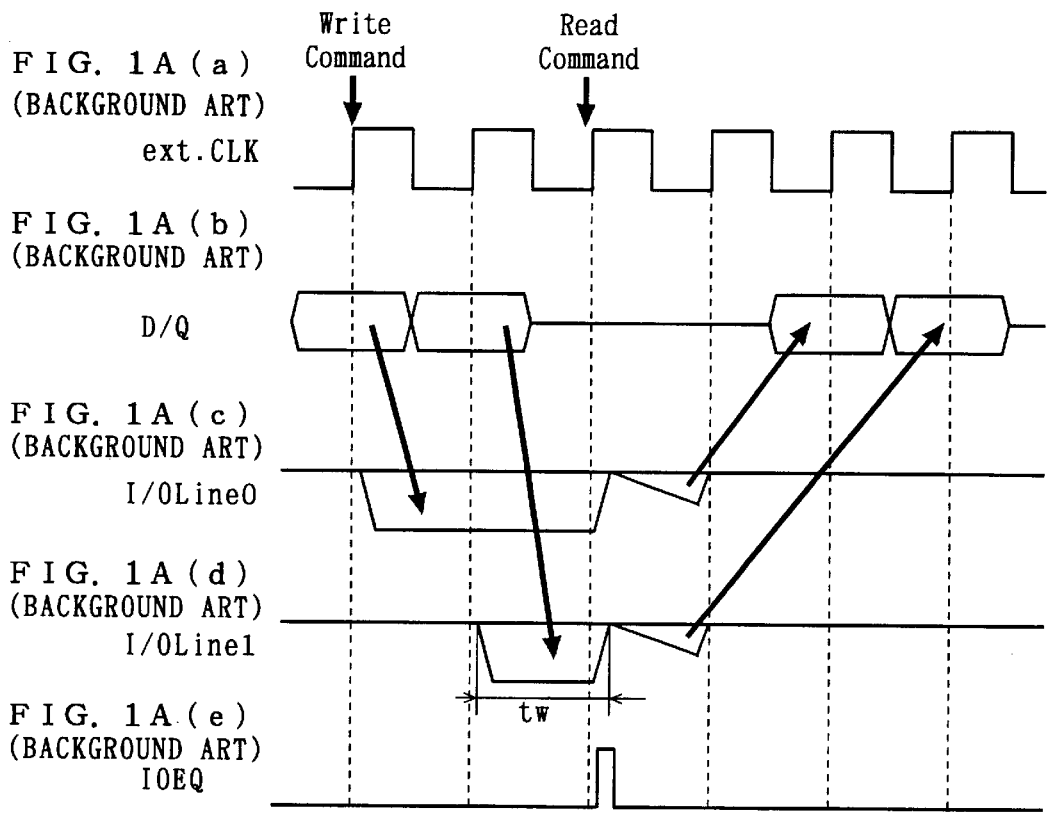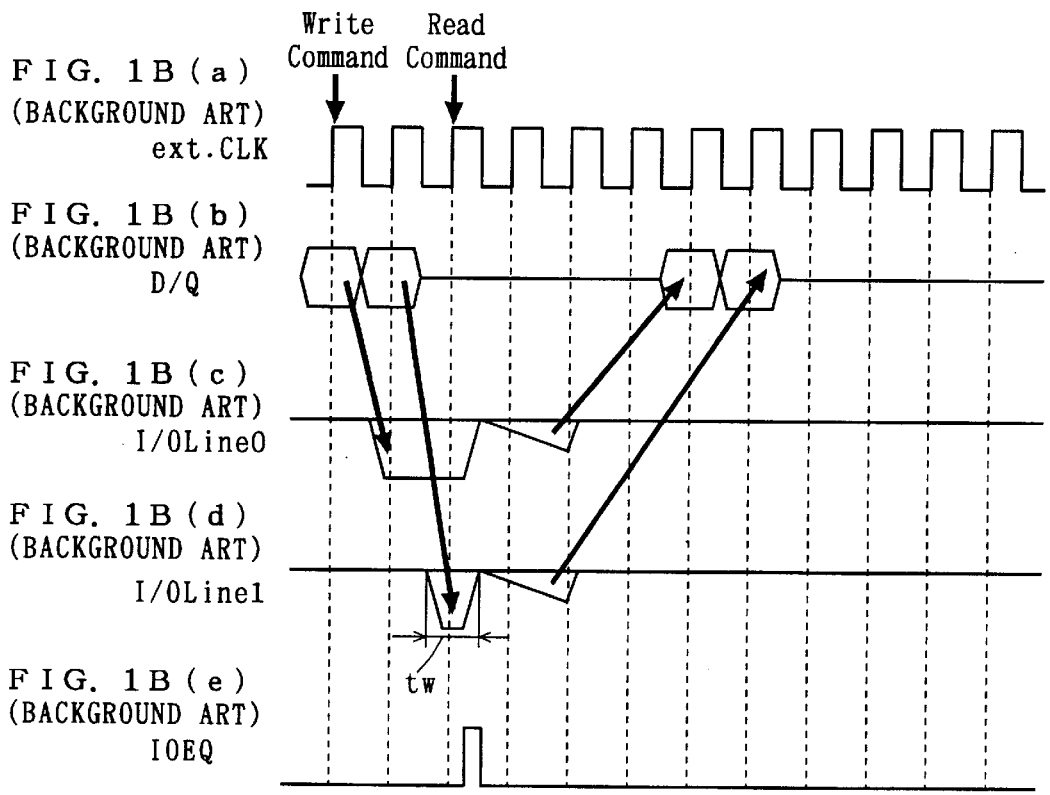

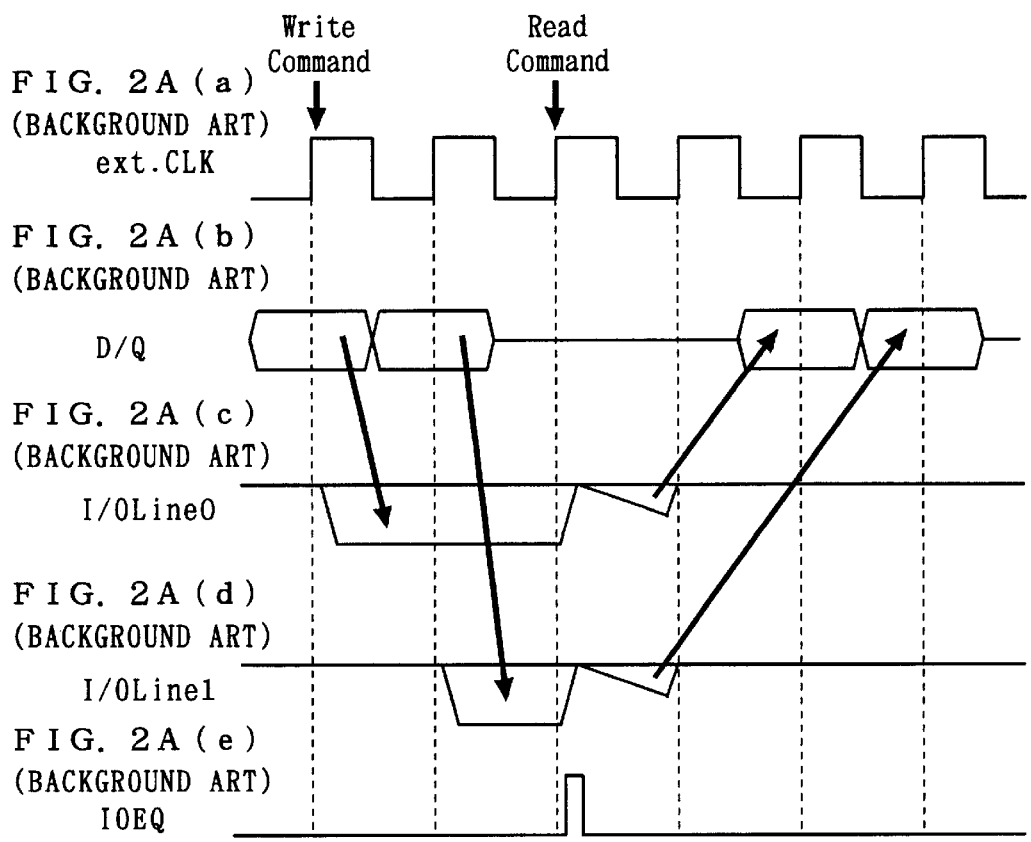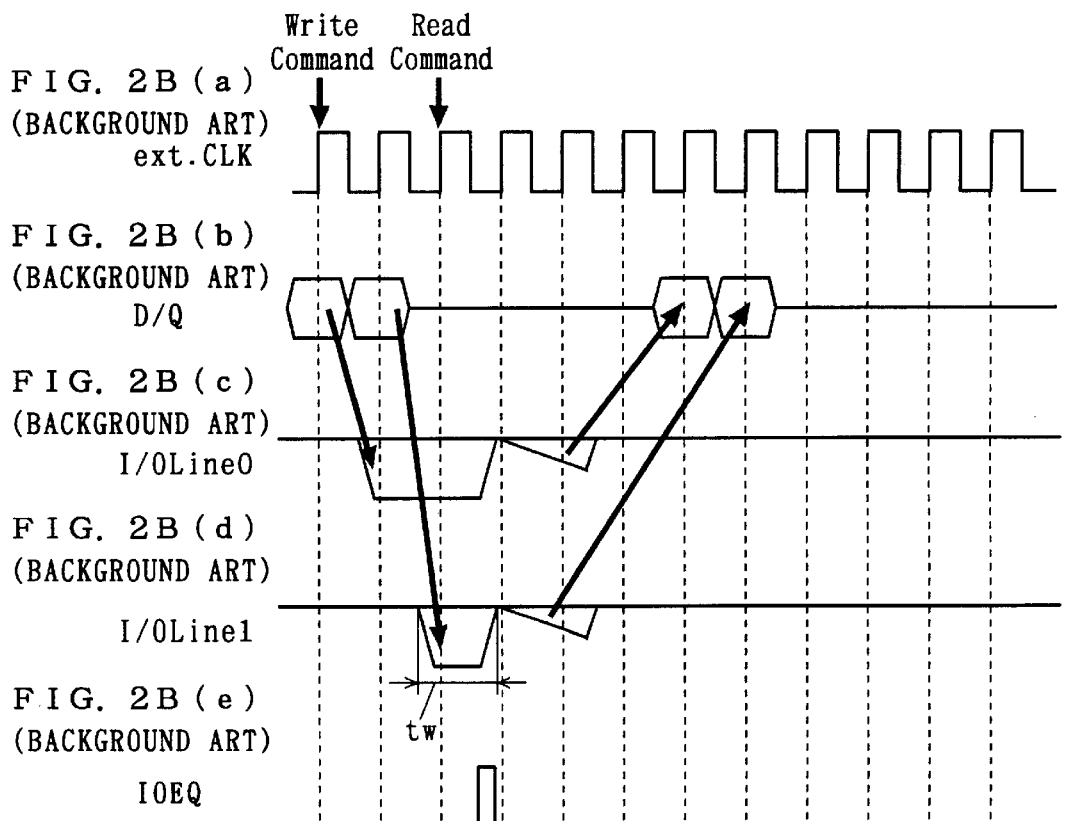

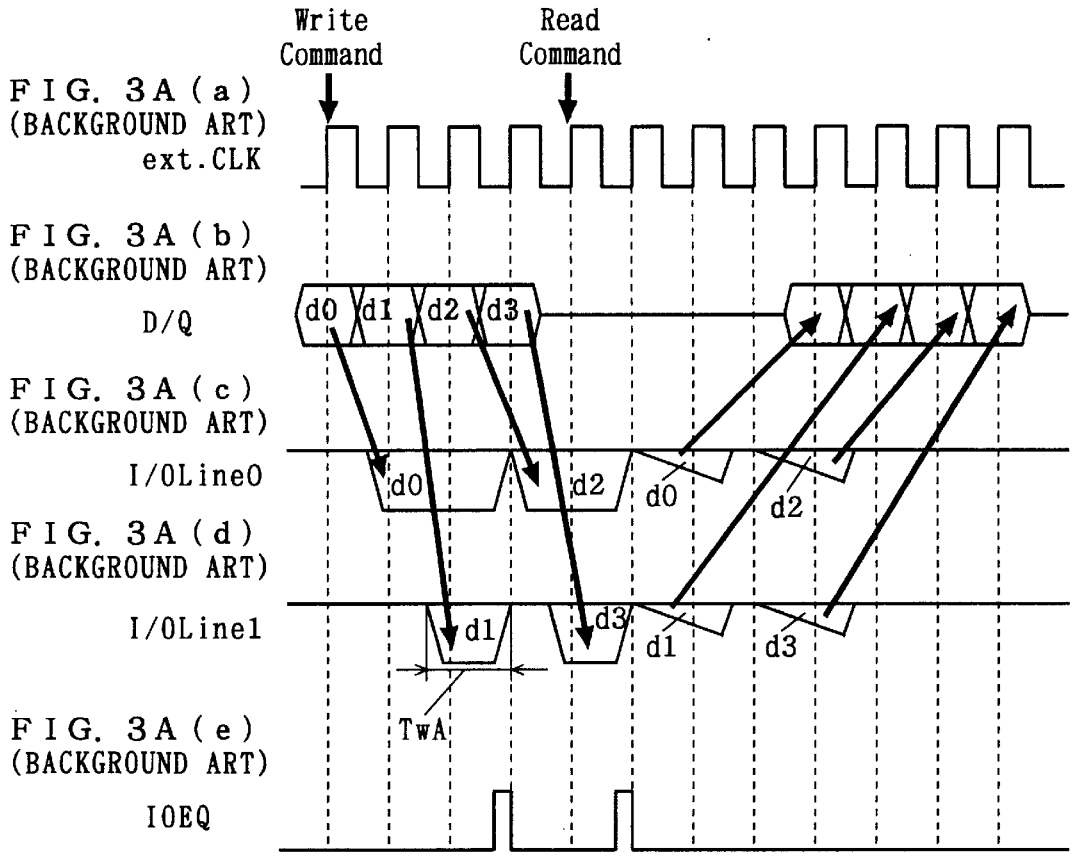
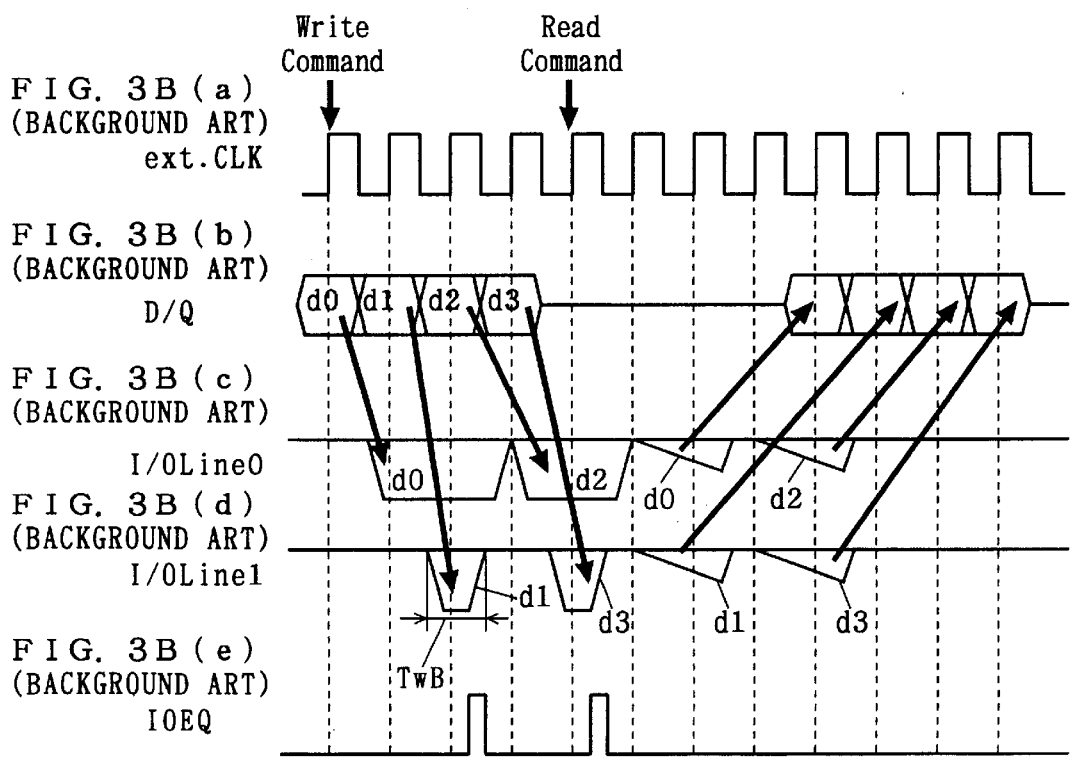

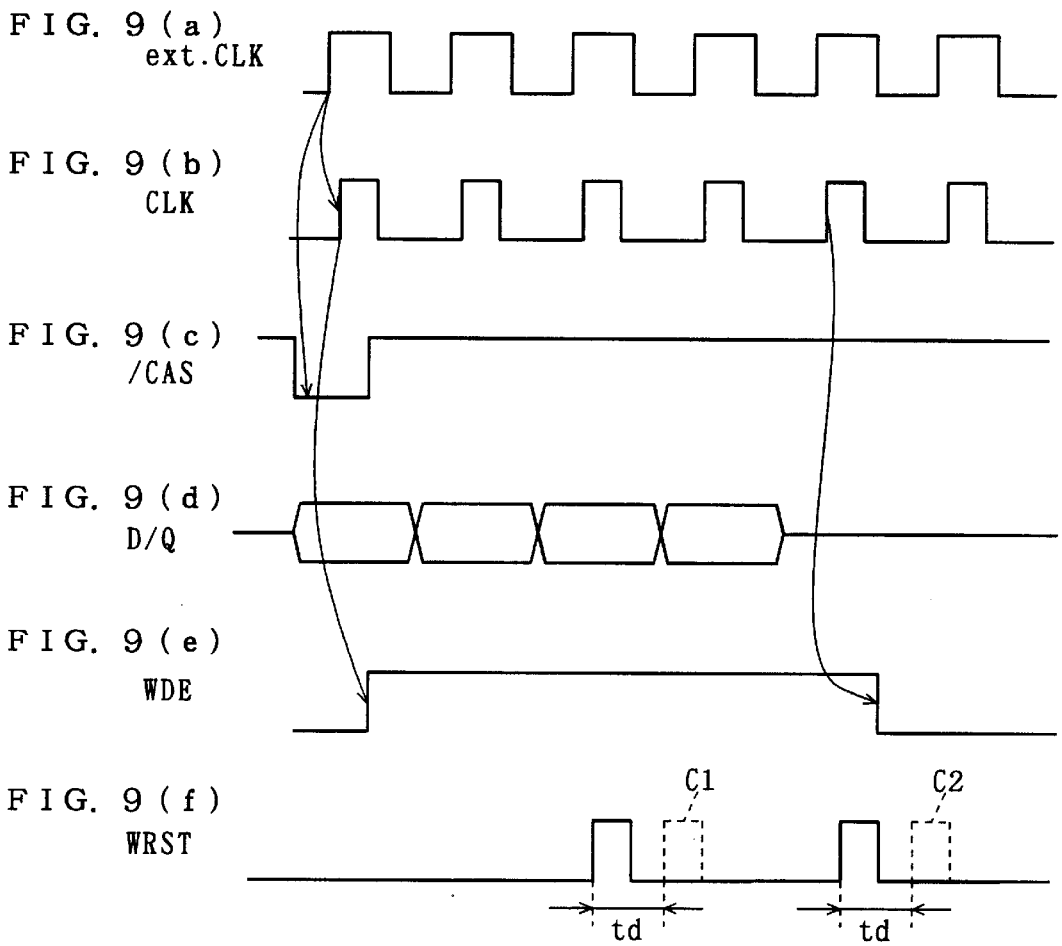
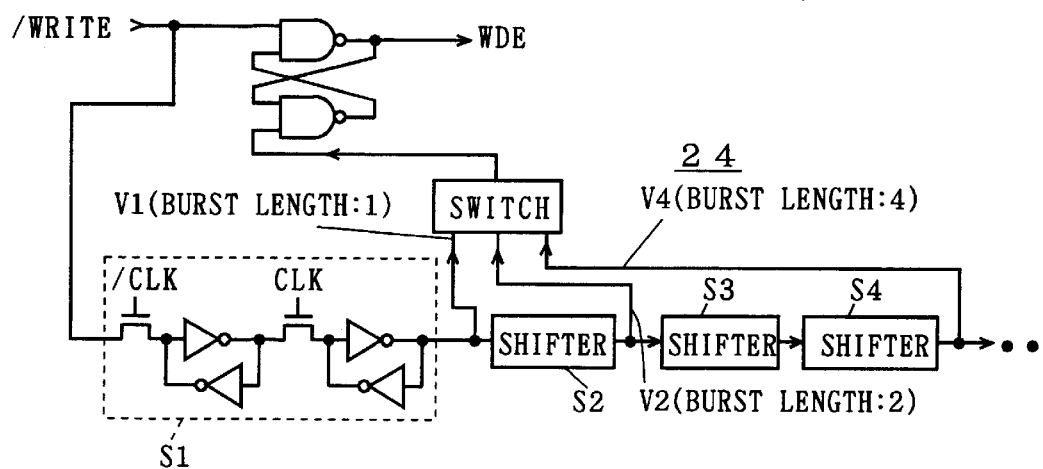

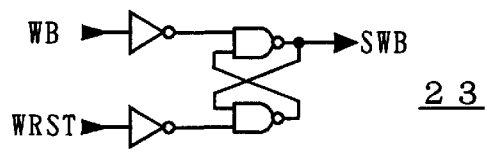
FIG. 11
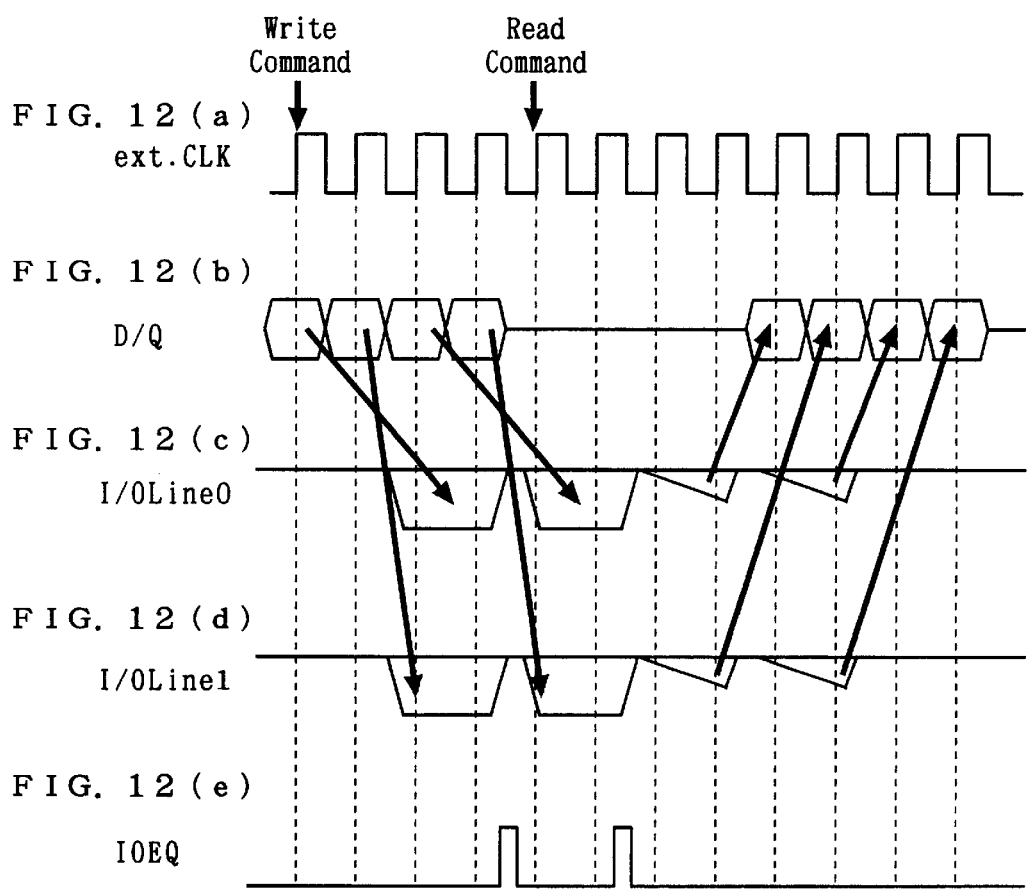
FIG. 12(a) ext.CLK
FIG. 12(b) D/Q
FIG. 12(c) I/OLine0
FIG. 12(d) I/OLine1
FIG. 12(e) IOEQ F I G. 1 3
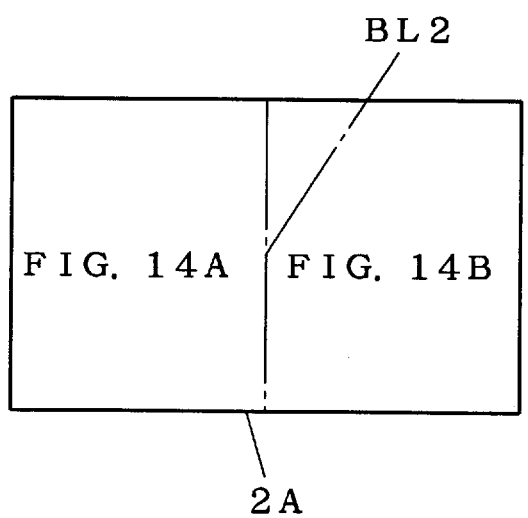

F I G. 1 4 A
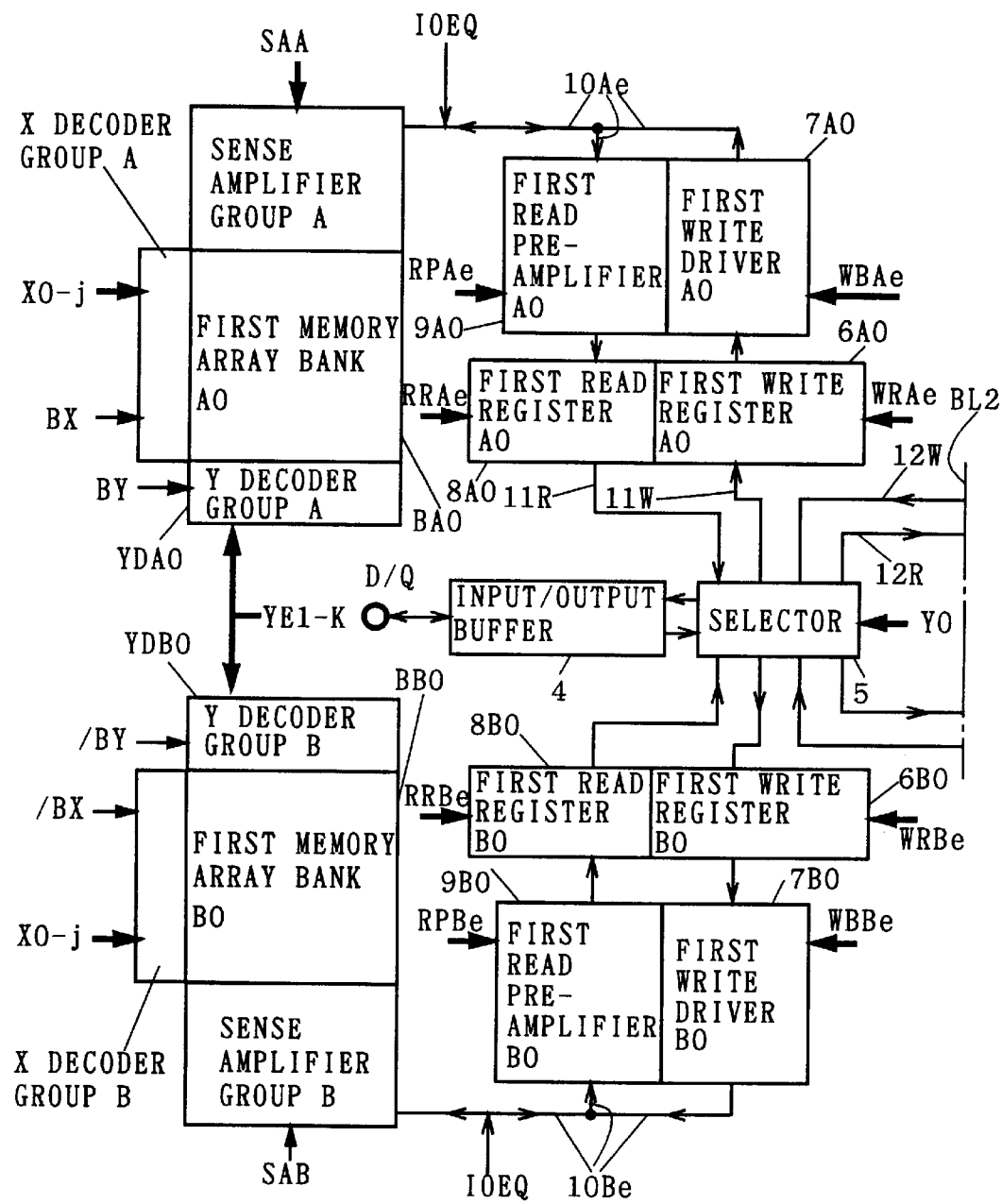

FIG. 18(a) ext.CLK
FIG. 18(b) CLK
FIG. 18(c) /CAS
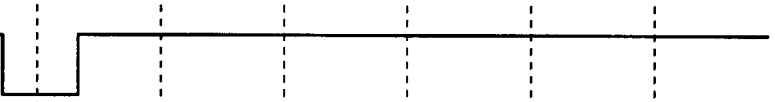
FIG. 18(d) /CAS0
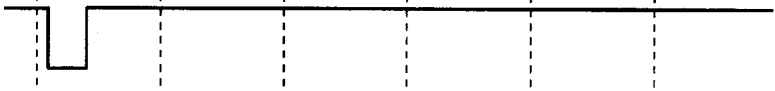
FIG. 18(e) CA0
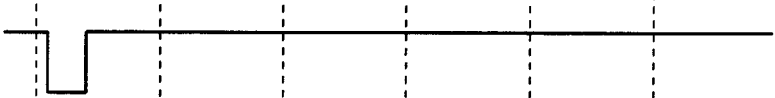
FIG. 18(f) WDE
FIG. 18(g) SEA
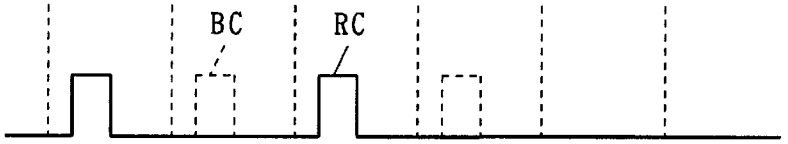

FIG. 19
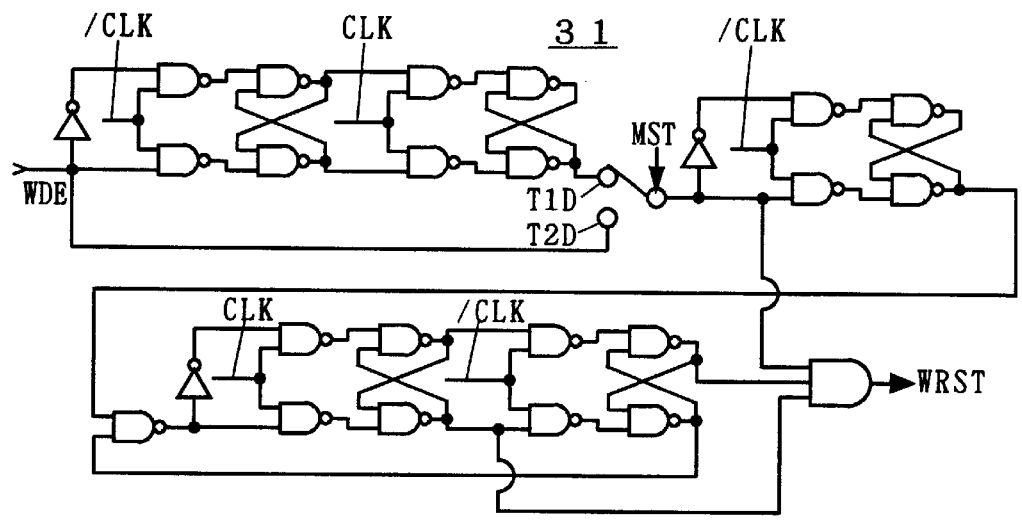
FIG. 20(a) ext.CLK
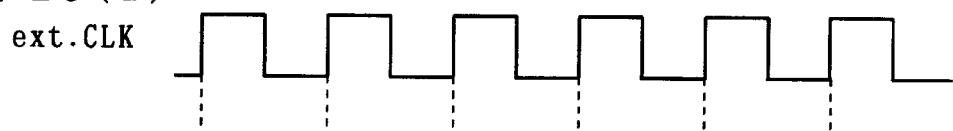
FIG. 20(b) CLK
FIG. 20(c) /CAS
FIG. 20(d) WDE
FIG. 20(e) WRST

FIG. 21(a)
(PRIOR ART)
ext.CLK
FIG. 21(b)
(PRIOR ART)
ext./CAS
FIG. 21(c)
(PRIOR ART)
D/Q
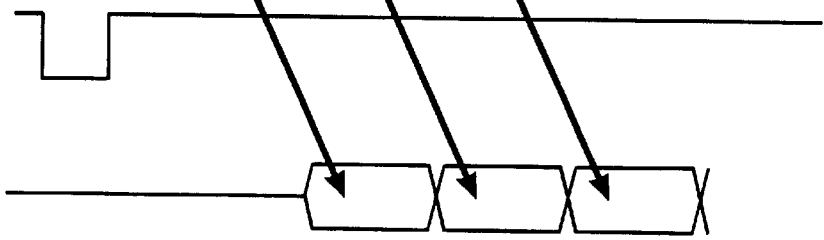
FIG. 22(a)
(BACKGROUND ART)
ext.CLK
FIG. 22(b)
(BACKGROUND ART)
ext./CAS
FIG. 22(c)
(BACKGROUND ART)
D/Q
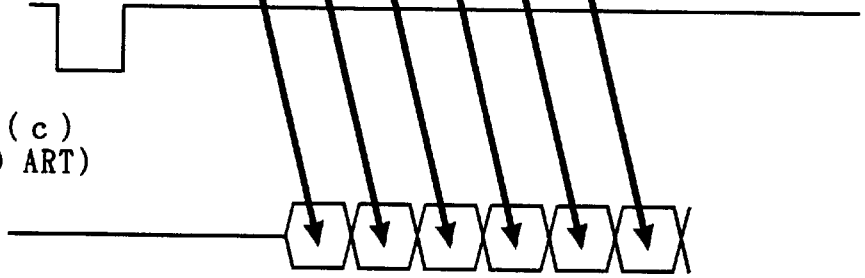

FIG. 23 ( a )
(BACKGROUND ART)
ext.CLK
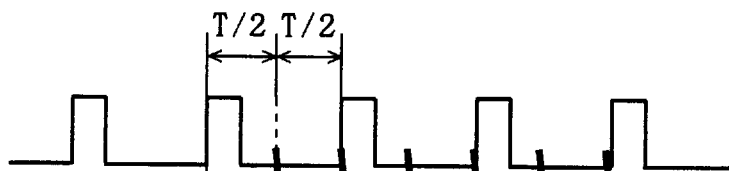
FIG. 23 ( b )
(BACKGROUND ART)
ext./CAS
FIG. 23 ( c )
(BACKGROUND ART)
D/Q
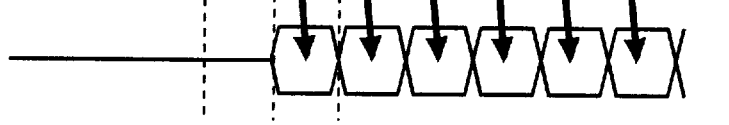
FIG. 23 ( d )
(BACKGROUND ART)
2×CLK

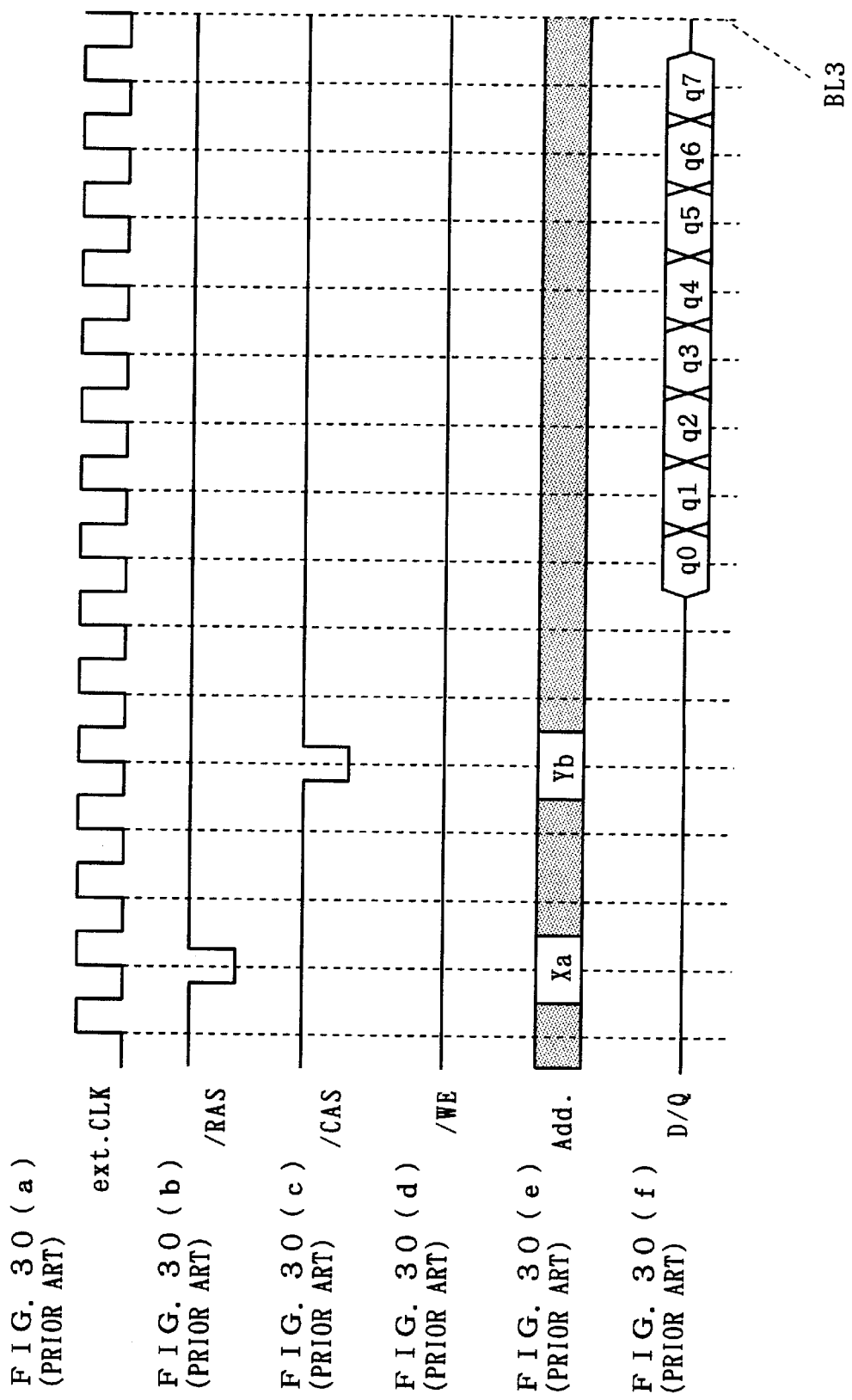

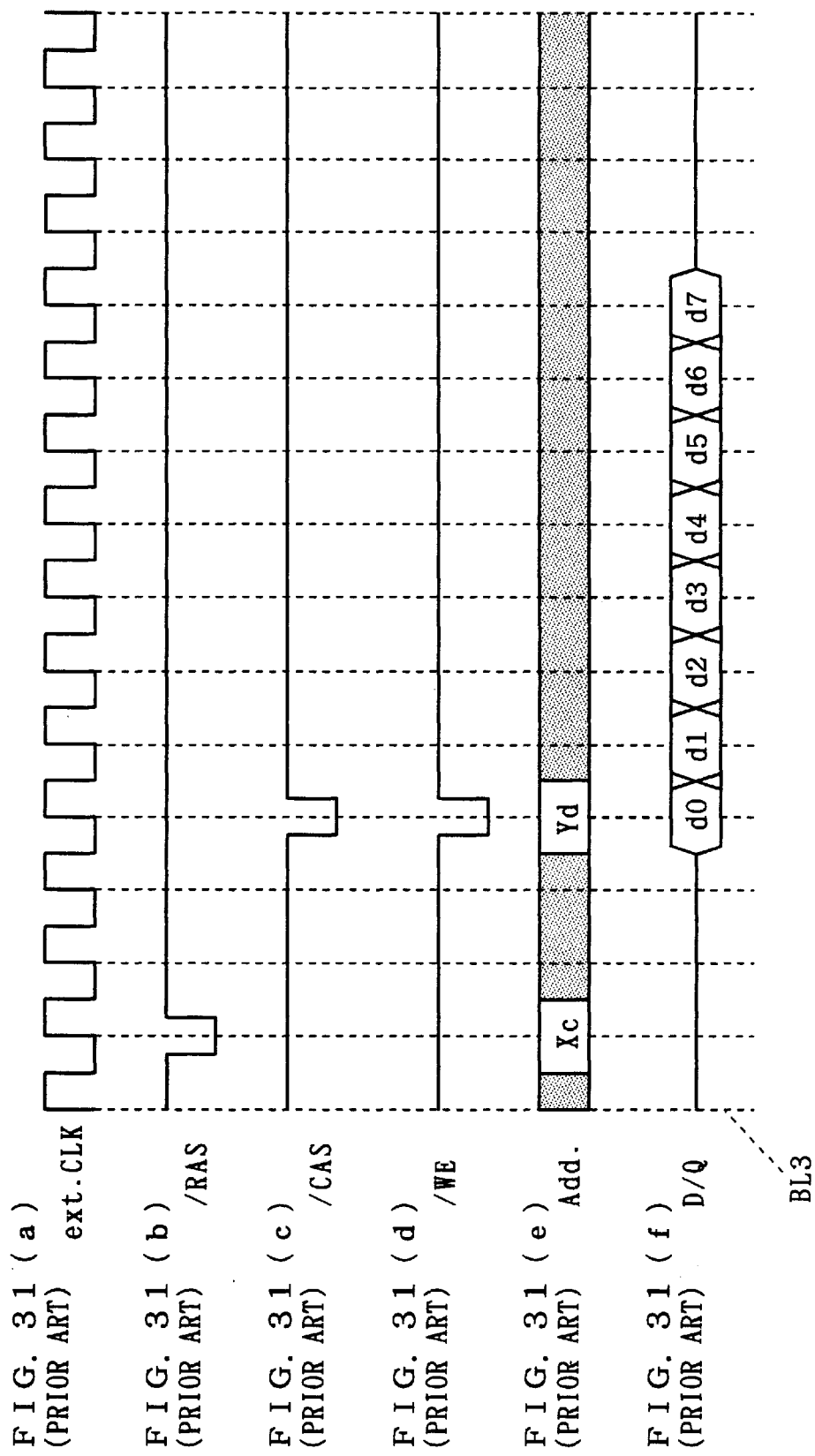

SYNCHRONOUS SEMICONDUCTOR MEMORY DEVICE RELIABLY FETCHING EXTERNAL SIGNAL IN SYNCHRONIZATION WITH CLOCK SIGNAL PERIODICALLY SUPPLIED FROM THE EXTERIOR

BACKGROUND OF THE INVENTION

1. Field of the Invention

The present invention relates to a synchronous semiconductor memory device fetching an external signal in synchronization with a clock signal periodically supplied from the exterior. More specifically, the present invention relates to a write control technique for a synchronous dynamic random access memory (hereinafter referred to as an SDRAM) which is accessible at random.

2. Description of the Background Art

While the speed of a dynamic random access memory (hereinafter referred to as a DRAM) employed as a main memory is being increased, its operating speed cannot still follow that of a microprocessor (hereinafter referred to as an MPU) under the present circumstances. Thus, it is frequently said that the access and cycle times of the DRAM serve as bottlenecks reducing the performance of the overall system. In recent years, however, an SDRAM operating in synchronization with an external system clock signal is proposed as a main memory for a high-speed MPU.

In relation to the SDRAM, proposed is a specification of continuously accessing 8-bit data as to a single data input/output terminal, for example, in synchronization with a system clock signal at a high speed in order to implement high-speed access. FIGS. 30(a) to 30(f) and FIGS. 31(a) to 31(f) are standard timing charts satisfying this specification of continuous access.

FIGS. 30(a) to 30(f) and FIGS. 31(a) to 31(f) show operations of an SDRAM capable of inputting and outputting 8-bit data (i.e., byte data) of eight data input/output terminals at (a) to (f) respectively. This SDRAM continuously writes or reads 8-bit data (data of 8×8=64 bits in total). The bit number of continuously read data is called a burst length, which can be changed by a mode register in the SDRAM.

In the SDRAM shown in FIGS. 30(a) to 30(f) and FIGS. 31(a) to 31(f), external control signals such as a row address strobe signal /RAS, a column address strobe signal /CAS, an address signal Add., a write enable signal /WE and the like are fetched into a memory chip in synchronization with the leading edge of an external clock signal ext.CLK which is a system clock, for example.

In the address signal Add., a row address signal X and a column address signal Y are multiplexed in a time-sharing manner. If the row address strobe signal /RAS is at a low level of an active state on the leading edge of the external clock signal ext.CLK, the current address signal Add. is fetched as a row address signal Xa.

If the column address strobe signal /CAS is at a low level of an active state on the leading edge of the external clock signal ext.CLK, on the other hand, the current address signal Add. is fetched as a column address signal Yb. A row and a column in the memory chip of the SDRAM are selected in accordance with the fetched row and column address signals Xa and Yb.

After a lapse of a prescribed clock period (three clock cycles in FIG. 30) from fall of the column address strobe signal /CAS to a low level, first 8-bit data D/Q is outputted. The clock cycle number between the fall of the column address strobe signal /CAS to a low level and the output of the data D/Q is called a "CAS latency", which can be set by a mode register similarly to the burst length. Thereafter data q1 to q7 are successively outputted in response to rise of the clock signal ext.CLK.

In a write operation, a row address signal Xc is fetched in a similar manner to the above data read operation. If both the column address strobe signal /CAS and the write enable signal /WE are at low levels of active states on the leading edge of the clock signal ext.CLK, a column address signal Yd is fetched while currently supplied data d0 is fetched as the first write data. In response to fall of these external control signals /RAS and /CAS, a row and a column are selected in the interior of the SDRAM. Thereafter input data d1, . . . , d7 are successively fetched in synchronization with the clock signal ext.CLK, and successively written in respective memory cells.

Thus, the operation of the SDRAM is different from that of a system in the conventional DRAM, i.e., that fetching the address signal, input data etc. in synchronization with the external control signals of the row and column address strobe signals /RAS and /CAS and making operations. The SDRAM fetches the external signals such as the address strobe signals /RAS and /CAS, the address signal Add., the write enable signal WE and the input data D/Q on the leading edge of the externally supplied system clock signal ext.CLK.

The aforementioned execution of fetching of external control signals and data in synchronization with an external clock signal and a data read operation synchronized with the external clock signal has such an advantage that the cycle time can be reduced while eliminating necessity of ensuring a margin with respect to a data input/output time resulting from a skew (deviation in timing) of the address signal. If such a synchronous operation can be executed, the speed of the continuous access operation can be increased.

In order to implement an SDRAM capable of a high-speed operation, the SDRAM may be so controlled as to be capable of continuous writing and reading of data every two bits and to perform a read operation while quickly ending a write operation.

As the operating frequency is increased, however, a sufficient time cannot be ensured for writing second-bit data. For example, the current SDRAM requires a write time of at least about 2 to 3 nsec. for writing second-bit data in a corresponding memory cell through an I/O line, and hence the upper limit of the operating frequency is restricted to about 150 MHz, in order to enable reading in practice. Therefore, it is necessary to make it possible to reliably execute data writing/reading also when the SDRAM is driven by a clock having an operating frequency which is higher than the frequency of about 150 MHz, on the premise that at least the aforementioned time is necessary as the write time for the second-bit data.

SUMMARY OF THE INVENTION

According to a first aspect of the present invention, a synchronous semiconductor memory device comprises storage means for continuously writing data of several bits inputted from an exterior in synchronization with a clock signal every predetermined bit number and continuously reading the data in synchronization with the clock signal every predetermined bit number, and control means for increasing a write period for the data by a predetermined time in response to increase of an operating frequency which is the frequency of the clock signal within the range of a latency and for controlling write and read operations for the data, and the latency corresponds to the cycle number of the clock signal up to reading of first-bit data among the data after a read command is inputted from the exterior.

According to a second aspect of the present invention, the clock signal is an external clock signal which is inputted from the exterior, and the control means comprises mode set means for detecting change of a period corresponding to the latency to a mode longer than a predetermined value on the basis of an address signal which is inputted from the exterior and outputting a mode set signal, and write period control means for increasing the write period in response to the mode set signal.

According to a third aspect of the present invention, the write period control means comprises write operation ending delay means for delaying ending of the write operation for the data by a specific time only when the mode set signal provides the change to the mode, and the specific time is decided on the basis of the minimum time necessary for writing the data.

According to a fourth aspect of the present invention, the write period control means comprises write operation delay means for delaying both starting and ending of the write operation for the data by a time corresponding to one clock cycle of the external clock signal only when the mode set signal provides the change to the mode.

According to a fifth aspect of the present invention, the storage means comprises memory array banks of a number corresponding to the predetermined bit number, a write driver which is provided for each of memory array banks and connected to the memory array banks through an input/output signal line, so that its operation is controlled by the control means, and a write register which is provided for each of memory array banks and connected to a data input line inputting the data from the exterior and the write driver, so that its operation is controlled by the control means, and the write period control means comprises write driver control signal generation means for generating a write driver control signal starting the write operation in response to a write command inputted from the exterior and ending the write operation in response to a lapse of clock cycles of the external clock signal corresponding to the predetermined bit number and outputting the same to the write driver when the mode set signal is at a level not instructing the mode change, while delaying the write driver control signal by the time corresponding to one clock cycle of the external clock signal thereby outputting a delayed signal when the mode set signal is at a level instructing the mode change.

According to a sixth aspect of the present invention, the control means comprises internal clock signal generation means for generating an internal clock signal corresponding to a double signal of an external clock signal inputted from the exterior as the clock signal in response to the level of a mode selection signal inputted from the exterior, and write period control means for increasing the write period in response to the time when the internal clock signal is generated.

According to a seventh aspect of the present invention, the control means further comprises mode set means for detecting change of a period corresponding to the latency to a mode which is longer than a predetermined value on the basis of an address signal inputted from the exterior and outputting a mode set signal, and the write period control means receives the internal clock signal and increases the write period in response to the mode set signal.

According to an eighth aspect of the present invention, the write period control means comprises write operation ending delay means for delaying ending of the write operation for the data by a specific time only when the mode set signal provides the change to the mode, and the specific time is decided on the basis of the minimum time necessary for writing the data.

According to a ninth aspect of the present invention, the write period control means comprises write operation delay means for delaying both starting and ending of the write operation for the data by a time corresponding to one clock cycle of the internal clock signal only when the mode set signal provides the change to the mode.

According to a tenth aspect of the present invention, the storage means comprises memory array banks of a number corresponding to the predetermined bit number, a write driver which is provided for each of memory array banks and connected to the memory array banks through an input/output signal line so that its operation is controlled by the control means, and a write register which is provided for each of memory array banks and connected to a data input line inputting the data from the exterior and the write driver so that its operation is controlled by the control means, and the write period control means comprises write driver control signal generation means for generating a write driver control signal starting the write operation in response to a write command inputted from the exterior and ending the write operation in response to a lapse of clock cycles of the internal clock signal corresponding to the predetermined bit number and outputting the same to the write driver when the mode set signal is at a level not instructing the mode change, while delaying the write driver control signal by the time corresponding to one clock cycle of the internal clock signal and outputting the delayed signal when the mode set signal is at a level instructing the mode change.

According to an eleventh aspect of the present invention, the clock signal is an external clock signal inputted from the exterior, and the control means comprises external clock signal monitor means for monitoring the external clock signal and outputting a mode set signal when the frequency of the external clock signal is higher than a predetermined frequency, and write period control means for increasing the write period in response to the time when the mode set signal is outputted.

According to a twelfth aspect of the present invention, the write period control means comprises write operation ending delay means for delaying ending of the write operation for the data by a specific time only when the mode set signal provides the change to the mode, and the specific time is decided on the basis of the minimum time necessary for writing the data.

According to a thirteenth aspect of the present invention, the write period control means comprises write operation delay means for delaying both starting and ending of the write operation for the data by a time corresponding to one clock cycle of the external clock signal only when the mode set signal provides the change to the mode.

According to a fourteenth aspect of the present invention, a synchronous semiconductor memory device continuously writing data of several bits inputted from an exterior in synchronization with an external clock signal every predetermined bit number and writing the data in synchronization with the external clock signal every predetermined bit number comprises a storage portion for writing the data and reading the data, and a write operation ending control circuit for delaying ending of an operation for writing the predetermined bit-numbered data in the storage portion by a predetermined time when a latency corresponding to the cycle number of the external clock signal up to reading of first-bit data among the data is set at a second latency which is longer than a first latency after a read command is inputted from the exterior.

According to a fifteenth aspect of the present invention, a synchronous semiconductor memory device continuously writing data of several bits inputted from an exterior in synchronization with an external clock signal every predetermined bit number and writing the data in synchronization with the external clock signal every predetermined bit number comprises a storage portion for writing the data and reading the data, and a control circuit for writing the data in the storage portion in a second write period longer than a first write period for the data which is necessary when the clock signal corresponds to an external clock signal inputted from an exterior, when the clock signal corresponds to a double clock signal of the external clock signal.

According to the first aspect of the present invention, the control means changes the write period for the data long within the range of the latency in response to increase of the operating frequency, whereby the write margin can be so enlarged that a period for writing all data of the predetermined bits can be ensured despite the increase of the operating frequency.

According to each of the second, seventh and fourteenth aspects of the present invention, the change of the latency to a longer mode by a command of the address signal from the exterior in response to increase of the operating frequency is utilized, whereby the write margin can be enlarged in response to the change quantity of the latency while the change of the latency can be readily detected. Thus, such a problem that it is difficult to ensure the write period for the predetermined bit-numbered data as the operation frequency is increased can be readily solved.

According to each of the third, eighth and twelfth aspects of the present invention, the write operation ending delay means delays ending of the data writing by the specific time, whereby the data write period is increased only by the specific time. Further, this specific time is set at the minimum time necessary at least for data writing. According to the present invention, therefore, the write margin can be enlarged by the minimum necessary time in response to each operating frequency.

According to each of the fourth, fifth, ninth, tenth and thirteenth aspects of the present invention, the margin for writing the predetermined bit-numbered data can be readily and reliably ensured by changing the write timing by one clock cycle of the external clock signal.

According to each of the sixth and fifteenth aspects of the present invention, the write period necessary for writing the predetermined bit-numbered data can be ensured by readily enlarging the write margin also in a synchronous semiconductor memory device performing data writing/reading (data transfer) with a double clock signal of the external clock signal.

According to the eleventh aspect of the present invention, enlargement/assurance of the write margin in response to increase of the operating frequency can be attained not by changing the write timing by a mode supplied from the exterior but by monitoring the frequency of the external clock signal itself.

An object of the present invention is to provide a synchronous semiconductor memory device which can reliably write/read data while ensuring a margin for a write time even if its operating frequency is relatively increased.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 1A($a$) to 1A($e$) and 1B($a$) to 1B($e$) are internal timing charts in writing;

FIGS. 2A($a$) to 2A($e$) and 2B($a$) to 2B($e$) are internal timing charts in writing according to a first embodiment of the present invention;

FIGS. 3A($a$) to 3A($e$) are timing charts showing a problem arising in the prior art;

FIGS. 3B($a$) to 3B($e$) are internal timing charts in writing according to the first embodiment;

FIGS. 9($a$) to 9($f$) are timing charts for illustrating the operation of the circuit shown in FIG. 8;

FIG. 10 is a block diagram showing the structure of a first control signal generation circuit;

FIG. 11 is a block diagram showing the structure of a circuit delaying inactivation timing for a write driver control signal;

FIGS. 12($a$) to 12($e$) are internal timing charts in writing according to a second embodiment of the present invention;

FIGS. 13, 14A and 14B are block diagrams showing the structure of a memory portion according to the second embodiment;

FIGS. 18($a$) to 18($g$) are timing charts for illustrating the operation of the circuit shown in FIG. 17;

FIG. 19 illustrates a write reset signal generation circuit;

FIGS. 20($a$) to 20($e$) are timing charts for illustrating the operation of the circuit shown in FIG. 19;

FIGS. 21($a$) to 21($c$) are timing charts of a synchronous semiconductor memory device in general data transfer;

FIGS. 22($a$) to 22($c$) are timing charts of a synchronous semiconductor memory device transferring data at a double speed;

FIGS. 23($a$) to 23($d$) are timing charts of a synchronous semiconductor memory device transferring data at a double speed;

FIGS. 30(a) to 30(f) are timing charts for illustrating the operation of an SDRAM; and FIGS. 31(a) to 31(f) are timing charts for illustrating the operation of the SDRAM.

DESCRIPTION OF THE PREFERRED EMBODIMENTS

Figure 4:
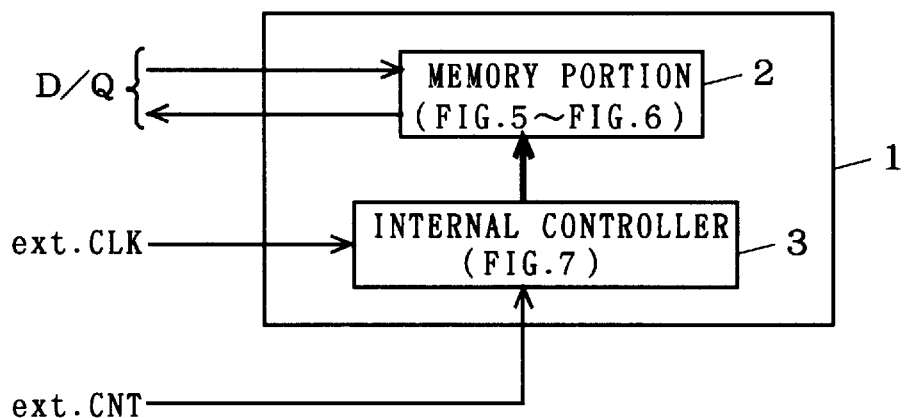
FIG. 4 is a block diagram showing the structure of a synchronous semiconductor device according to the first embodiment.

A write control system for an SDRAM according to the present invention is classified into the following four types:

1. When a time up to output of first-hit data after input of an external read command, i.e., a time corresponding to a CAS latency, is set in a relatively long mode from the exterior, ending of a write operation for 2-bit data is delayed by a specific time in response to the change of the aforementioned CAS latency.

2. In response to mode setting of changing the aforementioned CAS latency long, write timing itself is delayed by one clock cycle of an external clock signal for controlling writing/reading of 2-bit data. Consequently, it comes to that ending of writing of the 2-bit data is delayed by the aforementioned one clock cycle.

3. In case of a mode of transferring data through both edges of an external clock signal, the basic idea of the aforementioned system 1. or 2. is employed for delaying ending of writing of 2-bit data by a predetermined time determined by correlation with the current CAS latency. The term "predetermined time" employed herein indicates a concept including the specific time in the aforementioned system 1. and one clock cycle of the external clock signal in the aforementioned system 2., similarly to the following system 4.

4. The frequency of an external clock signal is monitored for delaying ending of writing of 2-bit data by a predetermined time determined by correlation with the CAS latency on the basis of the structure of the aforementioned system 1. or 2. when the monitored frequency becomes higher than a specific frequency.

In each of the systems 3. and 4., it is not necessarily required to set the CAS latency at a longer time in response to increase of an operating frequency.

(The First Embodiment)

This embodiment corresponds to the aforementioned system 1. First, the basic idea thereof is described with reference to the conventional case, followed by description of a hardware structure for embodying the same.

(FIGS. 1A(a) to 1A(e) and FIGS. 1B(a) to 1B(e) are continuous timing charts of write and read operations suggesting a problem in the conventional case. The burst length is 2. FIGS. 1A(a) to 1A(e) show cases of relatively low operating frequencies and FIGS. 1B(a) to 1B(e) show cases of relatively high operating frequencies. Symbols ext.CLK, D/Q, I/OLine0 and I/OLine1 denote an external clock signal, a data signal, a write state of first-bit data on an I/O line, and a write state of second-bit data on the I/O line, respectively. Symbol IOEQ denotes an equalizer signal.

When an operating frequency is increased, a CAS latency (clock number from input of a read command up to output of first-bit data) is set large. A mode register in an SDRAM executes this setting on the basis of an externally supplied address signal. The CAS latency is set at 2 in FIGS. 1A(a) to 1A(e), while the same is set at 4 in FIGS. 1B(a) to 1B(e). Thus, the CAS latency is set larger (mode setting) in response to increase of the frequency of the external clock signal, i.e., the operating frequency, thereby ensuring a read time for second-bit data. Thus, the read time is relaxed by increase of the CAS latency, while the write time (time tw in FIG. 1A(d) or FIG. 1B(d), for the second bit is not improved at all and hence shortened as the operating frequency is increased. Namely, the upper limit of the operating frequency is decided by the time required for writing in case of a synchronous semiconductor memory device. At least 2 to 3 nsec. is necessary as the aforementioned write time tw under the present circumstances, and hence the upper limit of the operating frequency is restricted to about 150 MHz. This point is as already described.

FIGS. 2A(a) to 2A(e) and FIGS. 2B(a) to 2B(e) are timing charts for illustrating a write control method according to this embodiment, for relaxing such an upper limit of the operating frequency. FIGS. 2A(a) to 2A(e) show case of relatively low operating frequencies and FIGS. 2B(a) to 2B(e) show cases of relatively high operating frequencies, and symbols identical to those in FIGS. 1A(a) to 1A(e) and FIGS. 1B(a) to 1B(e) denote the same signals and states.

This system shown in FIGS. 2A(a) to 2A(e) and FIGS. 2B(a) to 2B(e) is different from the system shown in FIGS. 1A(a) to 1A(e) and FIGS. 1B(a) to 1B(e) in a point that ending of a write operation for 2-bit data (prescribed hit data) is delayed by a specific time when the operating frequency becomes relatively high (for example, the standard thereof is about 150 MHz under the present circumstances). Namely, when the CAS latency is set large in accordance with increase of the operating frequency for relaxing read timing, a part of the time for the read operation can be utilized as a write time. Therefore, this system notes this point, for ensuring the write time by enlarging a write margin. Thus, at least 2 to 3 nsec. can be ensured as a write time tw for second-bit data shown in FIG. 2B(d).

FIGS. 3A(a) to 3A(e) and FIGS. 3B(a) to 3B(e) show operations in case of a burst length of 4. FIGS. 3A(a) to 3A(e) are timing charts of the present invention, and FIGS. 3B(a) to 3B(e) are conventional timing charts. Write times TwA and TwB for second-bit data shown in FIGS. 3A(d) and 3B(d) are in relation of TwA>TwB, and a write margin in the present invention is enlarged and can be ensured at a sufficient value.

Figure 5:
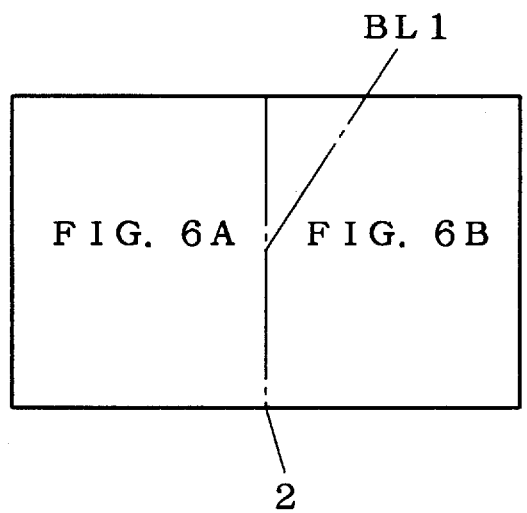
FIGS. 5, 6A and 6B are block diagrams showing the structure of the memory portion.
Figure 6A:
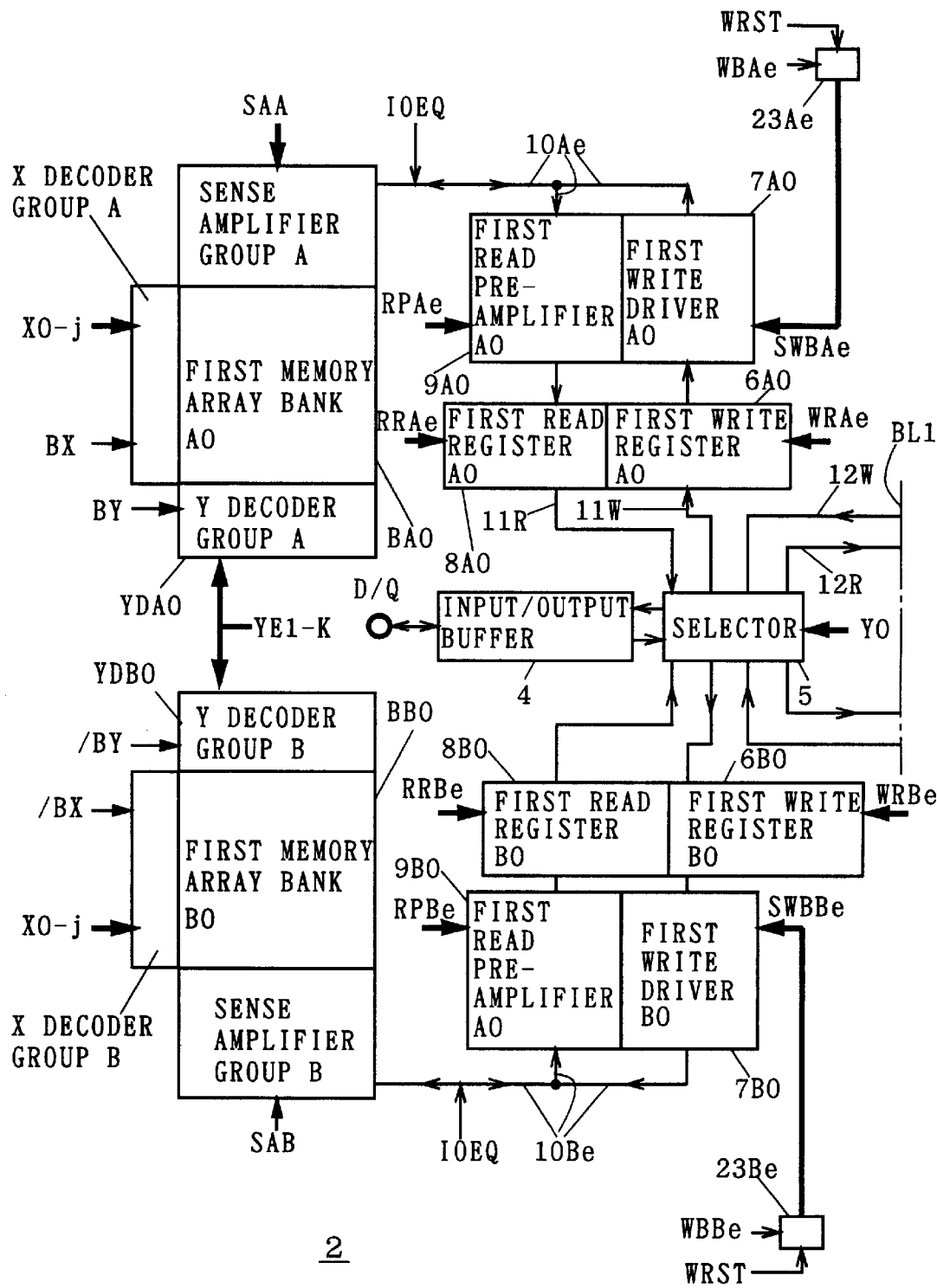
Figure 6B:
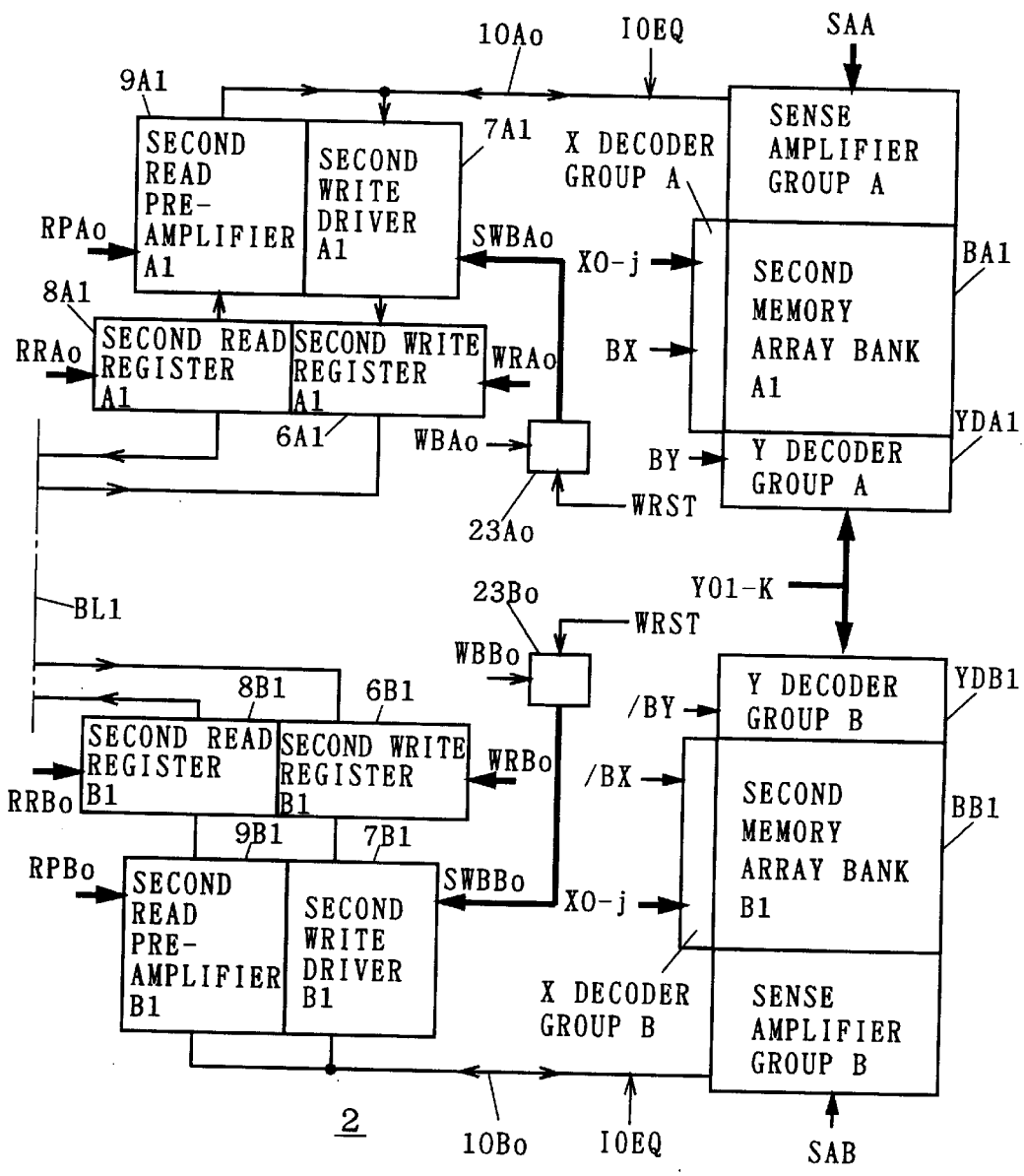
Figure 7:
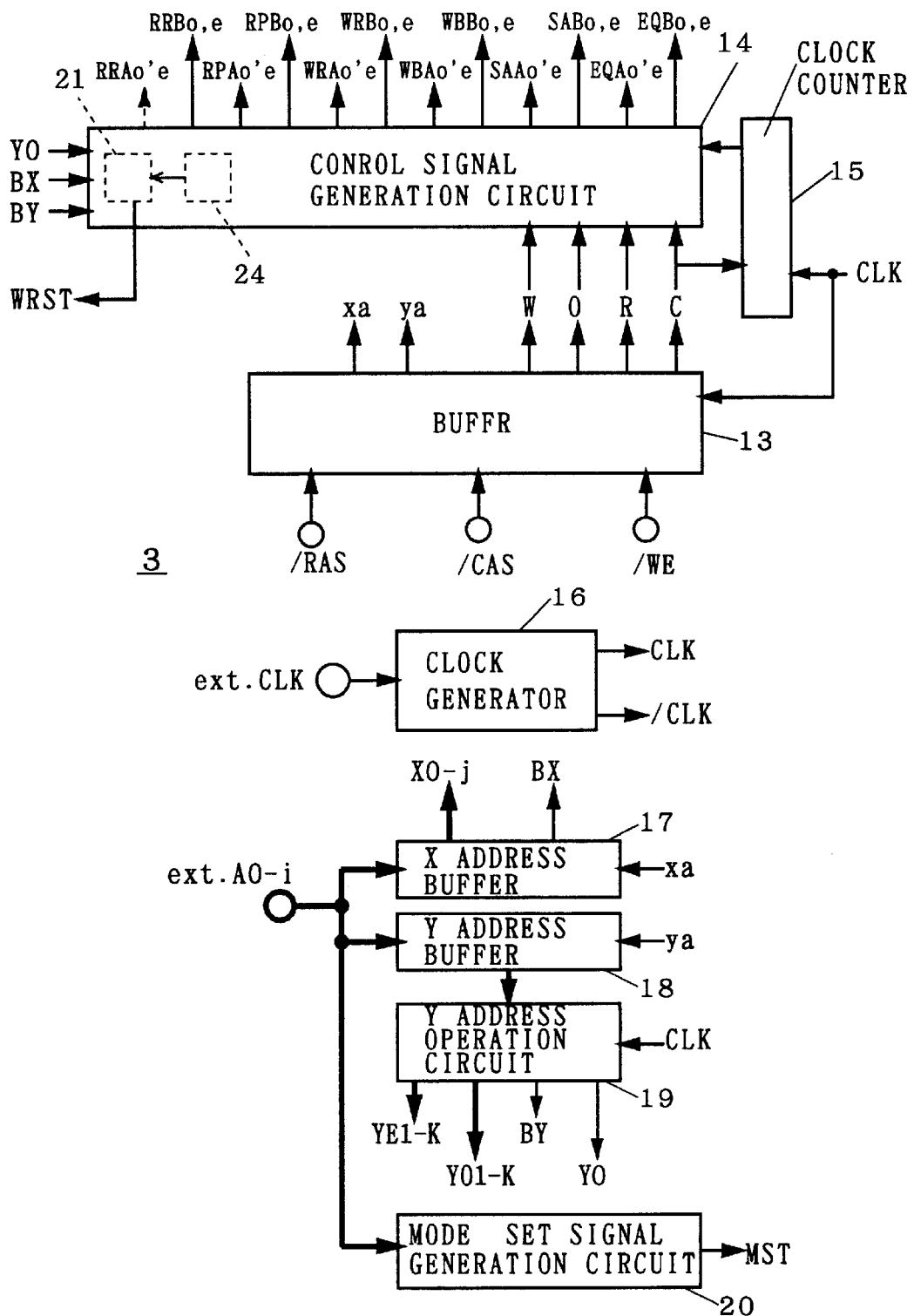
FIG. 7 is a block diagram showing the structure of an internal controller.

A circuit structure for executing the aforementioned system 1. is now described. First, FIG. 4 is a conceptual diagram of this SDRAM device 1, which is roughly divided into a memory portion 2 (or storage portion) and an internal controller 3 (or control portion). Referring to FIG. 4, symbol ext.CNT denotes an external control signal generically indicating respective signals /RAS, /CAS, /WE and the like described later. FIGS. 5, 6A and 6B are block diagrams showing the internal structure of the memory portion 2 shown in FIG. 4. FIG. 7 is a block diagram showing the structure of the internal controller 3 shown in FIG. 4.

One of different points of the memory portion 2 shown in FIGS. 5, 6A and 6B from that of a standard DRAM is that the interior of this memory portion 2 is separated into a plurality of memory array banks (two first memory array banks A0 and B0 and two second memory array banks A1 and B1 are provided here). Another point is that a selector 5 whose switching is controlled by the least significant bit Y0 of a column address divides writing/reading of data D/Q received in an input/output buffer 4 into two paths, so that the inputted data D/Q can be continuously written every two bits and continuously read every two bits for enabling a high-speed operation. If the aforementioned least significant bit Y0 is "0" as that utilizing the memory array banks provided with symbol A, for example, the selector 5 selects a first data input/output line 11W (in writing) or 11R (in reading), while the selector 5 selects a second data input/output line 12W (in writing) or 12R (in reading) if the least significant bit Y0 is "1". FIGS. 5, 6A and 6B show two-bank structures, for example. If the number of banks is increased, registers, buffers and I/O lines are newly required by the increased number. The first and second memory array banks A0 (B0) and A1 (B1) can be accessed independently of each other. As hereinabove described, the data D/Q is sorted to be written in the first memory array bank A0 (B0) or in the second memory array bank A1 (B1), depending on the value of the least significant bit Y0 of a Y address externally supplied when a write command is inputted (the row address strobe signal /RAS, the column address strobe signal /CAS and the write enable signal /WE are activated).

A clock generator 16 shown in FIG. 7 generates an internal clock signal CLK of the same frequency as the external clock signal ext.CLK in synchronization therewith, in order to avoid the point that the duty of the external clock signal ext.CLK is not necessarily stable. While the internal controller 3 and the memory portion 2 shown in FIG. 4 operate in synchronization with the internal clock signal CLK, therefore, it can be said that these operations are synchronous with the external clock signal ext.CLK after all. In such meaning, the term "clock signal" corresponds to a broader term including external and internal clock signals.

A mode register (not shown) receives an external address signal ext.A0-i and sets a burst length and a CAS latency. A mode set generation circuit 20 shown in FIG. 7 is a part of this mode register.

Figure 8:
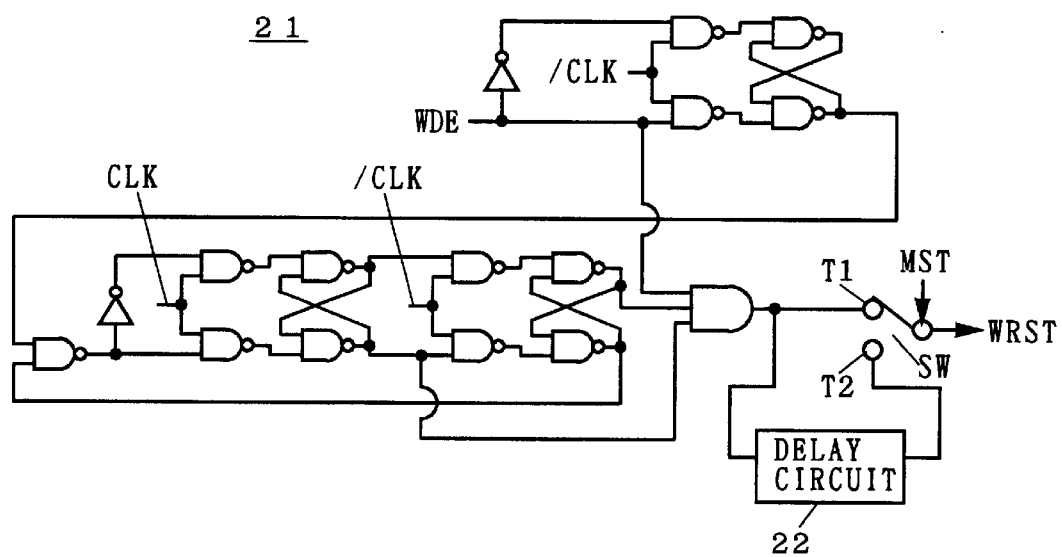
FIG. 8 illustrates a write reset signal generation circuit according to the first embodiment.

FIG. 8 illustrates the structure of a write reset signal generation circuit 21 provided in a control signal generation circuit 14 shown in FIG. 7, and FIGS. 9(a) to 9(f) are timing charts for illustrating the operation of the circuit 21 shown in FIG. 8. A first control signal WDE shown in FIG. 8 is activated when the write command (/RAS, /CAS and /WE) is inputted in response to rise of the external clock signal ext./CLK (strictly speaking, activated in synchronization with the leading edge of the internal clock signal CLK), and then, it is inactivated triggering the leading edge of the following internal clock signal CLK after the data D/Q having the burst length is written into its corresponding memory array bank (see FIG. 9(e)).

As clearly understood from FIG. 8, the write reset signal generation circuit 21 has a shifter function of outputting one pulse every two cycles of the internal clock signal CLK after the first control signal WDE is activated, and is provided with a switch SW for outputting the result of the shifter function as a write reset signal WRST as such or temporarily passing the result through a delay circuit 22 and outputting the same as the write reset signal WRST in response to the level of a mode set signal MST described later. The mode set signal MST controlling this switch SW, which is generated by the mode set signal generation circuit 20 shown in FIG. 7, varies its level with the CAS latency set in response to the operating frequency from the external address signal ext.A0-i.

FIG. 10 shows the structure of a generation circuit 24 for the first control signal WDE shown in FIGS. 7, 8 and FIG. 9(e). This circuit 24 is also a part of the control signal generation circuit 14 shown in FIG. 7. Referring to FIG. 10, symbols S1 to S4 denote shifters respectively, and signals V1, V2 and V4 are selected when the burst length is 1, 2 and 4 respectively. A write command signal /WRITE corresponds to an output signal from a NAND circuit (not shown) receiving respective signals CAS, RAS and WE.

In this SDRAM device, activation of write drivers 7A0, 7B0, 7A1 and 7B1 shown in FIGS. 5 and 6 is ended by activation of the write reset signal WRST outputted from the circuit 21 shown in FIG. 8. Writing in the first and second memory array banks is performed every 2-bit data D/Q in this architecture, and hence it comes to that the SDRAM device resets the corresponding write driver by the write reset signal WRST when 2-bit data D/Q are inputted from the exterior. Namely, it comes to that the aforementioned resetting is performed every two clock cycles of the internal clock signal CLK in this structure. In this device, the mode set signal MST delays the reset timing by a specific time. The mode set signal MST may be generated in linkage with the CAS latency. Namely, the CAS latency is set by the mode register (mode setting) in response to the timing of the external address signal ext.A0-i (FIG. 7).

With reference to FIGS. 5 to 10, the detail of a write operation is as follows:

When a write command is inputted in a buffer 13 shown in FIG. 7, X and Y address buffers 17 and 18 and a Y address operation circuit 19 are activated, and A-side Y decoder groups YDA0 and YDA1, for example, are activated in accordance with the externally supplied address signal ext.A0-i. First data is stored in a first write register 6A0 in response to activation of a control signal WRAe, and thereafter a write driver control signal WBAe (hence a signal SWBAe) is activated (the signal WRST is inactive in this stage), so that first-bit data D/Q stored in the first write register 6A0 is written in the first memory array bank A0 through a first I/O line 10Ae. Second-bit data D/Q supplied on the following leading edge of the internal clock signal CLK is stored in a second write register 6A1 by switching of the selector 5, and thereafter a write driver control signal WBAo (hence a signal SWBAo) is activated (the signal WRST is inactive), whereby the second-bit data stored in the second write register 6A1 is written in the second memory array bank A1 through a second I/O line 10Ao. When writing of the 2-bit data D/Q is ended, the signals SWBAe and SWBAo are inactivated in response to activation of the signal WRST, and the first and second I/O (input/output) lines 10Ae and 10Ao connecting the first and second memory array banks A0 and A1 with the first and second write drivers 7A0 and 7A1 are equalized by activation of the equalizer signal IOEQ, so that this SDRAM device prepares for writing of next 2-bit data.

In the aforementioned write operation, this SDRAM device delays the inactivation timing for the corresponding write driver control signals WBAo and WBAe by a specific time (with no delay of the activation timing therefor) through circuits 23Ao and 23Ae (corresponding to parts of a control portion) as hereinabove described, thereby delaying the write end time for 2-bit data by the specific time and increasing the write period. A clock serving as the bearer for this delay function is the write reset signal WRST. This point is now described in detail. The circuits 23Ae, 23Ao, 23Be and 23Bo may alternatively be provided in the circuit 14 shown in FIG. 7.

When the operating frequency is relatively low (lower than the 150 MHz order, for example), i.e., when the CAS latency is set at 3, for example (the current CAS latency corresponds to a first latency) in FIG. 8, the circuit 20 shown in FIG. 7 sets the level of the mode set signal MST at a value for switching the switch SW to a first output end T1. In this case, the write reset signal WRST is delayed by two clock cycles of the internal clock signal CLK and thereafter activated as a one-shot pulse, after input of a write command. Therefore, the circuits 23Ao and 23Ae output the inputted write driver control signals WBAo and WBAe as the write driver control signals SWBAo and SWBAe as such.

When the operating frequency is further increased (beyond 150 MHz) and the CAS latency is set at a larger value, e.g., at 4 (this corresponds to a second latency), on the other hand, the mode set signal MST switches the switch SW toward a second output end T2. Consequently, the write reset signal WRST is delayed by two clock cycles of the internal clock signal CLK and a delay time td (specific time) set in the delay circuit 22 after input of the write command, and thereafter activated as one-shot pulses C1 and C2 (in FIG. 9(f)).

The set value for the delay time td must be at least the minimum time (2 to 3 nsec. in the present circumstances) necessary for writing second-bit data, and it can also be said sufficient. Hence, td≧2 to 3 nsec. Consequently, it comes to that the write driver control signals WBAo and WBAe inputted in the circuits 23Ao and 23Ae are outputted with a delay by the delay time td when the CAS latency is set large, and the timing for transition of the write driver control signals SWBAo and SWBAe from active to inactive states is delayed by the delay time td.

It is assumed that numeral 23 is employed for generically denoting the inactivation delay circuits 23Ao, 23Ac, 23Bo and 23Be, and FIG. 11 shows the concrete structure of such a circuit 23. Referring to FIG. 11, symbol WB generically denotes the write driver control signals WBAo, WBBo, WBBe and WBAe.

From the above description, it is possible to implement the result shown in FIGS. 3A(a) to 3A(e) according to this embodiment, by delaying the activation timing for the write reset signal WRST by the specific time thereby delaying ending of data writing in case of ending activation of the write driver by activation of the write reset signal WRST.

The circuits 14 and 23 in this embodiment correspond to a "write period control portion", and the circuit 23 corresponds to a "write operation end delay portion" in particular.

(The Second Embodiment)

This embodiment embodies the aforementioned system 2. Namely, while the first embodiment is adapted to delay the timing for resetting (inactivating) the write operation by the specific time, a similar effect can be attained by delaying the timing for the write operation by one clock cycle of the aforementioned external clock signal ext.CLK or the internal clock signal CLK. In this case, not only the resetting of writing but activation of the write operation must be delayed by one clock cycle. FIGS. 12(a) to 12(e) are timing charts showing exemplary timing in this embodiment. Referring to FIGS. 12(a) to 12(e), symbols identical to those in FIGS. 3A(a) to 3A(e) represent the same signals. In this example, the burst length is 4, and the CAS latency is 4. Comparing FIGS. 12(c) to 12(e) with FIGS. 3B(c) to 3B(e), it is clearly understood that the respective signals in FIGS. 12(a) to 12(e) are delayed by one clock cycle of the external clock signal ext.CLK (or the internal clock signal CLK) as compared with those in FIGS. 3B(a) to 3B(e).

Figure 14B:
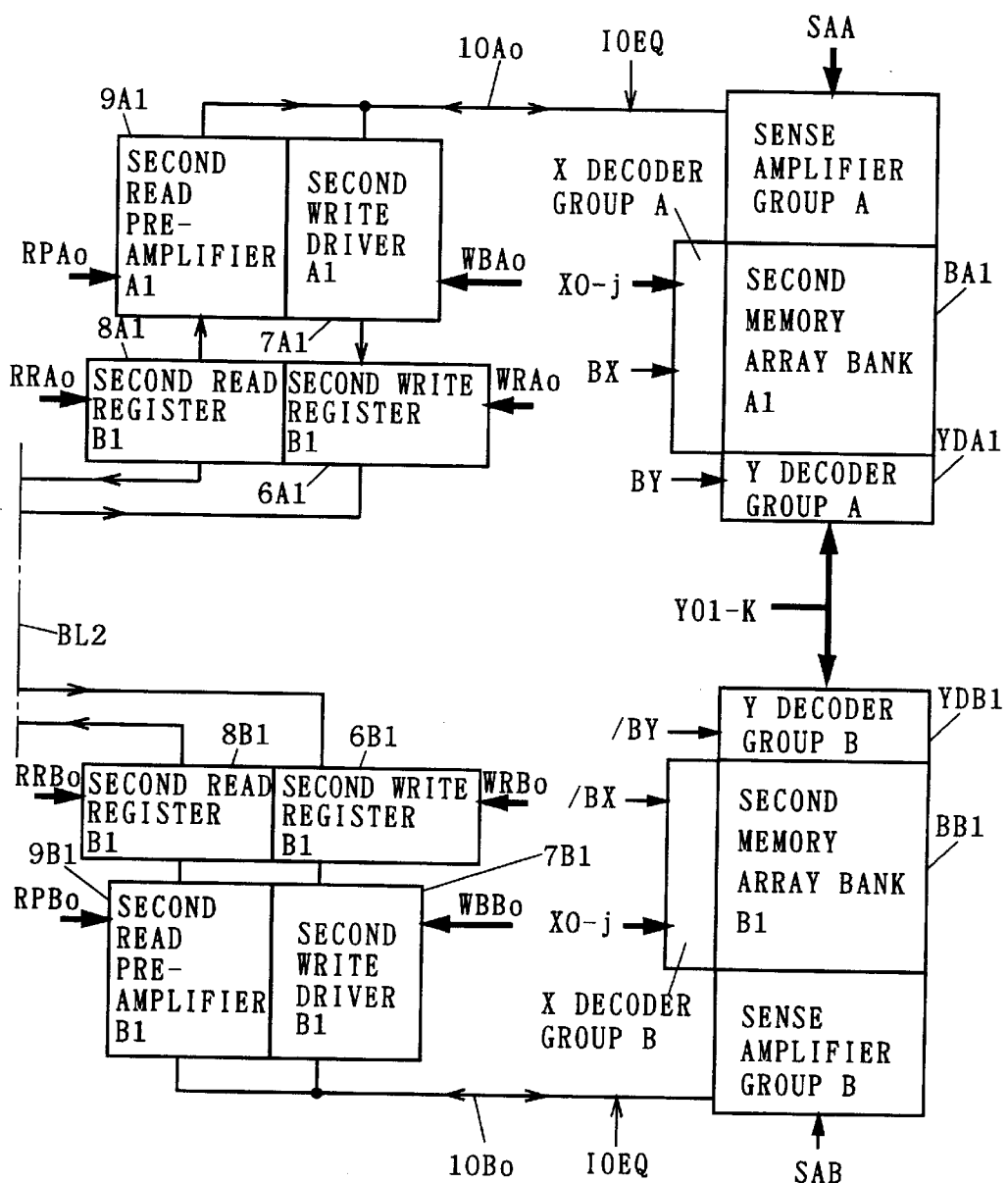
Figure 15:
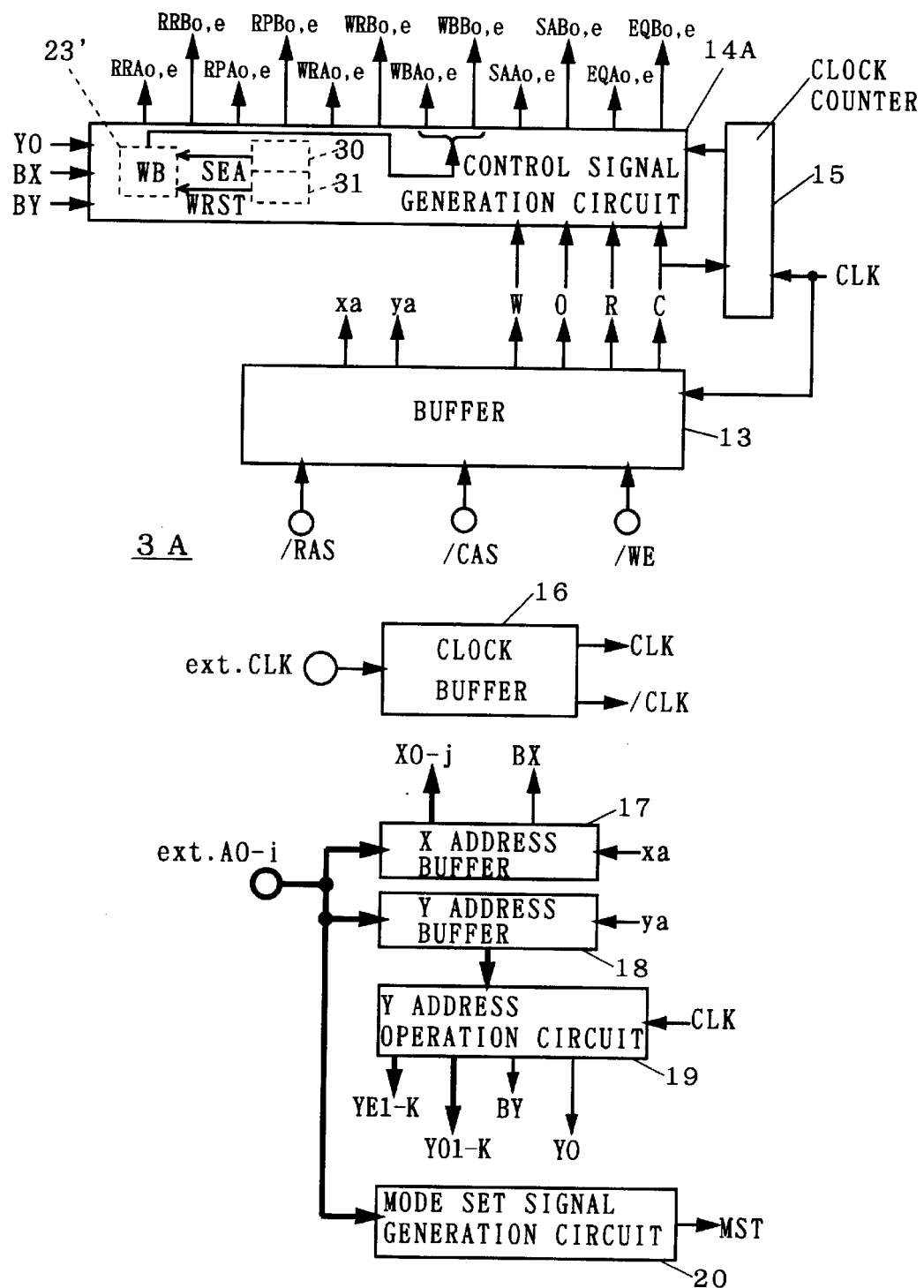
FIG. 15 is a block diagram showing the structure of an internal controller according to the second embodiment.

FIGS. 13 and 14 show the structure of a memory part 2A in an SDRAM device according to this embodiment, and FIG. 15 shows an internal controller 3A. These are different from the respective parts 2 and 3 according to the first embodiment in points that (1) a control signal generation circuit 14A further has a generation circuit part 30 for a second control signal SEA, and (2) a write driver control signal generation circuit 23' in this circuit 14 A delays activation and inactivation of write drivers further by one clock cycle in response to the signals SEA and WRST (and hence the circuit 23Ao etc. in the first embodiment are unnecessary). The remaining points of this embodiment are identical to those of the first embodiment.

Figure 16:
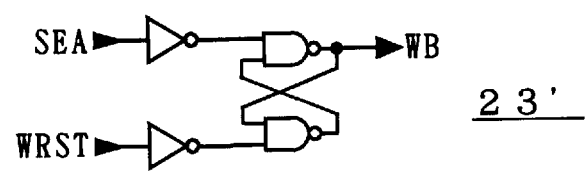
FIG. 16 illustrates a write driver control signal generation circuit according to the second embodiment.

FIG. 16 illustrates an exemplary circuit 23' generating a write driver control signal for controlling write drivers 7A0, 7A1, 7B0 and 7B1 to activation/inactivation. This circuit 23' forms a circuit in the control signal generation circuit 14A shown in FIG. 15. Referring to FIG. 16, symbol WB generically denotes write driver control signals WBAo, WBAe etc. From FIG. 16, the write driver control signal WB, hence the write drivers are activated when the second control signal SEA goes high, while the signal WB, hence the write drivers are inactivated when the write reset signal WRST goes high. This embodiment can be implemented by changing these signals SEA and WRST by one clock cycle of an internal clock signal CLK with the mode set signal MST described with reference to the first embodiment.

Figure 17:
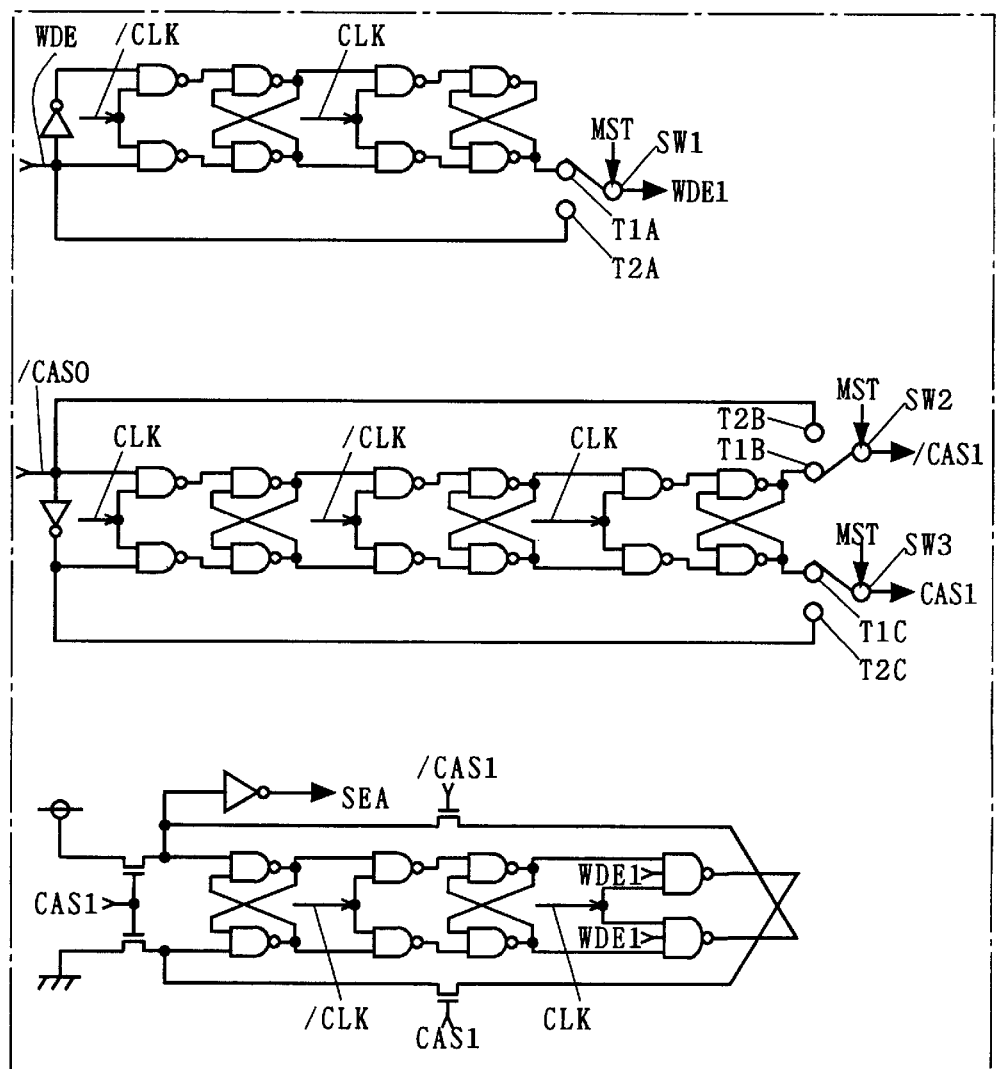
FIG. 17 illustrates a second control signal generation circuit.

FIG. 17 shows an exemplary generation circuit 30 for the second control signal SEA, and FIGS. 18(a) to 18(g) are timing charts for illustrating the operation of the circuit 30 shown in FIG. 17. A signal CA0 shown in FIG. 18(e) supplies the least significant bit (corresponding to a signal Y0 in FIG. 15) of a column address signal. This circuit 30 also forms a circuit in the control signal generation circuit 14A shown in FIG. 15. As described with reference to the first embodiment, a first control signal WDE is activated when a write command is inputted, and then, it is inactivated triggering the leading edge of the following internal clock signal CLK after the data D/Q having the burst length is written. When the burst length is 4, for example, the first control signal WDE is inactivated on the fifth clock from starting of writing. This SDRAM device employs an architecture of writing data D/Q every two bits, and hence the second control signal SEA is activated once every two clock cycles of the internal clock signal CLK. Therefore, the activation timing for the second control signal SEA is shifted by one clock cycle of the internal clock signal CLK by switching control by the mode set signal MST. Referring to FIG. 18(g), (i) a solid line RC shows the timing of the signal SEA for a relatively low operating frequency (the CAS latency is 3, for example), and (ii) the broken lines BC show the timing of the signal SEA for a relatively high operating frequency (the CAS latency is 4, for example).

A generation circuit for the first control signal WDE is identical to the circuit shown in FIG. 10.

Referring to FIG. 17, the mode set signal MST controls first to third switches SW1, SW2 and SW3 toward second terminals T2A, T2B and T2C in the aforementioned case (i), to result in no delay of the second control signal SEA. In the aforementioned case (ii), on the other hand, the mode set signal MST controls the first to third switches SW1 to SW3 toward first terminals T1A, T1B and T1C, to result in a delay of the second control signal SEA by one clock cycle.

FIG. 19 shows an exemplary generation circuit 31 for the write reset signal WRST, and FIGS. 20(a) to 20(e) are timing charts for illustrating the operation of this circuit 31. This circuit 31 also forms a part of the control signal generation circuit 14A shown in FIG. 15. Generation of the write reset signal WRST is also activated once every two clock cycles similarly to the case of the second control signal SEA, and when the operating frequency is increased and a mode register changes the CAS latency to a higher value, the mode set signal MST switches this activation timing to be delayed by one clock cycle. Referring to FIG. 20(e), solid lines RC1 and RC2 correspond to the aforementioned case (i) in FIGS. 18(a) to 18(g), and broken lines BC1 and BC2 correspond to the aforementioned case (ii) in FIGS. 18(a) to 18(g).

From the above, a write margin for 2-bit data can be reliably ensured when the operating frequency is increased and the CAS latency is set at a second value (e.g., 4) larger than the first latency, by delaying the internal timing for writing by one clock cycle of the external or internal clock cycle.

In this embodiment, the circuit 14A takes charge of the main function of a "write period control portion", and the circuits 24, 30, 31 and 23' function as a "write operation delay portion" or a "write driver control signal generation portion" in particular.

(The Third Embodiment)

Each of the first and second embodiments is adapted to change the internal timing for writing in response to setting of the CAS latency which is changed in response to the operating frequency, enlarging the margin for writing 2-bit data and ensuring the same to a necessary value.

As shown in FIGS. 21(a) to 21(c) and FIGS. 22(a) to 22(c), also conceivable is such application of switching a case (in FIGS. 21(a) to 22(c)) of transferring data D/Q on the leading edge of an external clock signal ext.CLK and a case (in FIGS. 22(a) to 22(c)) of transferring the data D/Q on each edge of an external clock signal ext.CLK (in practice, an internal clock signal twice the external clock signal ext.CLK is generated and employed as a trigger) in a synchronous semiconductor memory device. Also in this case, the operating frequency is doubled in the latter and hence such a problem can be encountered that a write margin for 2-bit data disappears. Also in this case, therefore, an effect similar to those of the first and second embodiments can be attained by applying the technique of the first or second embodiment.

As shown in FIGS. 23(a) to 23(d), a similar effect can also be attained by applying the technique of the first or second embodiment in correspondence to switching of the case shown in FIGS. 21(a) to 21(c) and the case shown in FIGS. 23(a) to 23(d) in a synchronous semiconductor memory device not utilizing both edges of an external clock but employing the leading edge thereof and the center of two leading edges as triggers, i.e., by generating an internal clock signal 2×CLK rising in synchronization with the timing of the leading edge and that of the center and employing this internal clock signal 2×CLK as a trigger to transfer data D/Q. Referring to FIG. 23(a), symbol T denotes one cycle of an external clock signal ext.CLK.

Figure 24:
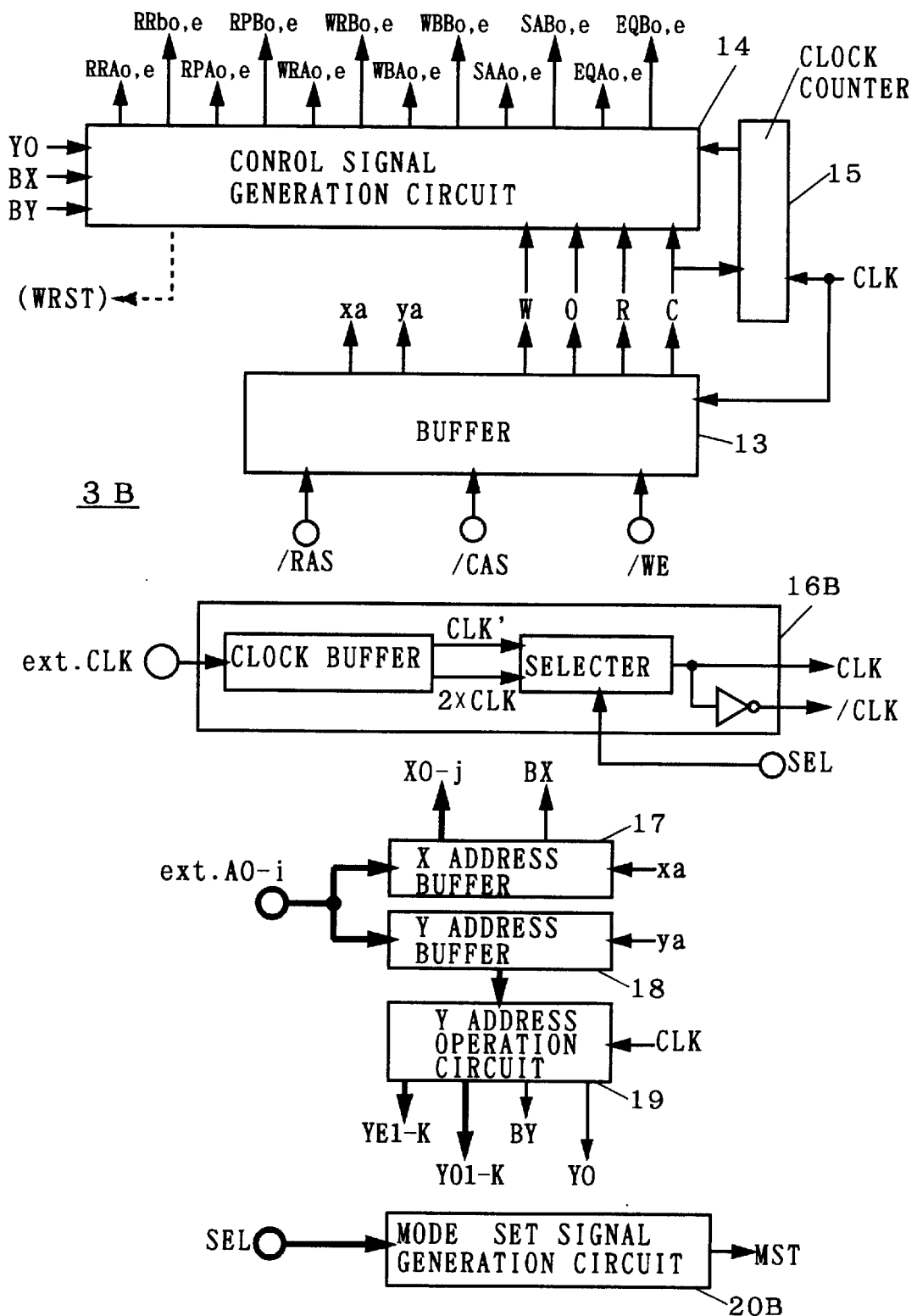
FIG. 24 is a block diagram showing an internal controller according to a third embodiment of the present invention.

FIG. 24 shows the structure of an internal controller 3B in an SDRAM device according to the third embodiment of the present invention. The remaining structures of this embodiment are identical to those in the figures employed with reference to the first or second embodiment. An internal clock signal generation circuit 16B and a mode set signal generation circuit 20B are different as compared with the first and second embodiments. A selection signal SEL inputted from an external memory controller (not shown) changes its level in response to either the case shown in FIGS. 21(a) to 21(c) or the case shown in FIGS. 22(a) to 22(c) or in FIGS. 23(a) to 23(d). When the selection signal SET is at a first level (the case shown in FIGS. 21(a) to 21(c)), the internal clock signal generation circuit 16B generates and selects internal clocks similar to those in the first and second embodiments, and outputs the same as internal clock signals CLK and /CLK. When the selection signal SET is at a second level (the case shown in FIGS. 22(a) to 22(c) or in FIGS. 23(a) to 23(d)), on the other hand, this circuit 16B generates and selects the internal clock 2×CLK having the timing shown in FIG. 22(c) or in FIG. 23(d), and outputs this internal clock 2×CLK as the internal clock signals CLK and /CLK.

The level of a mode set signal MST is set at a predetermined value in response to the level of the selection signal SEL. The mode set signal generation circuit 20B also forms a part of a mode register.

From the above, it is possible to enlarge a write margin according to this embodiment, by changing the write period to a second write period which is longer by a predetermined time than a first write period for prescribed bit data necessary when the external clock signal corresponds to a "clock signal" in a synchronous semiconductor memory device having a double data transfer quantity shown in FIGS. 22(a) to 22(c) or in FIGS. 23(a) to 23(d).

(The Fourth Embodiment)

While each of the first and second embodiments changes the write period to be longer by external supply of a mode changing the read timing, it is also possible to change the write period in response to a monitor result while monitoring the frequency of an external clock signal. This embodiment is an example of the latter case, and the structure of the interior of a memory for changing the write period is basically identical to those of the first and second embodiments.

Figure 25:
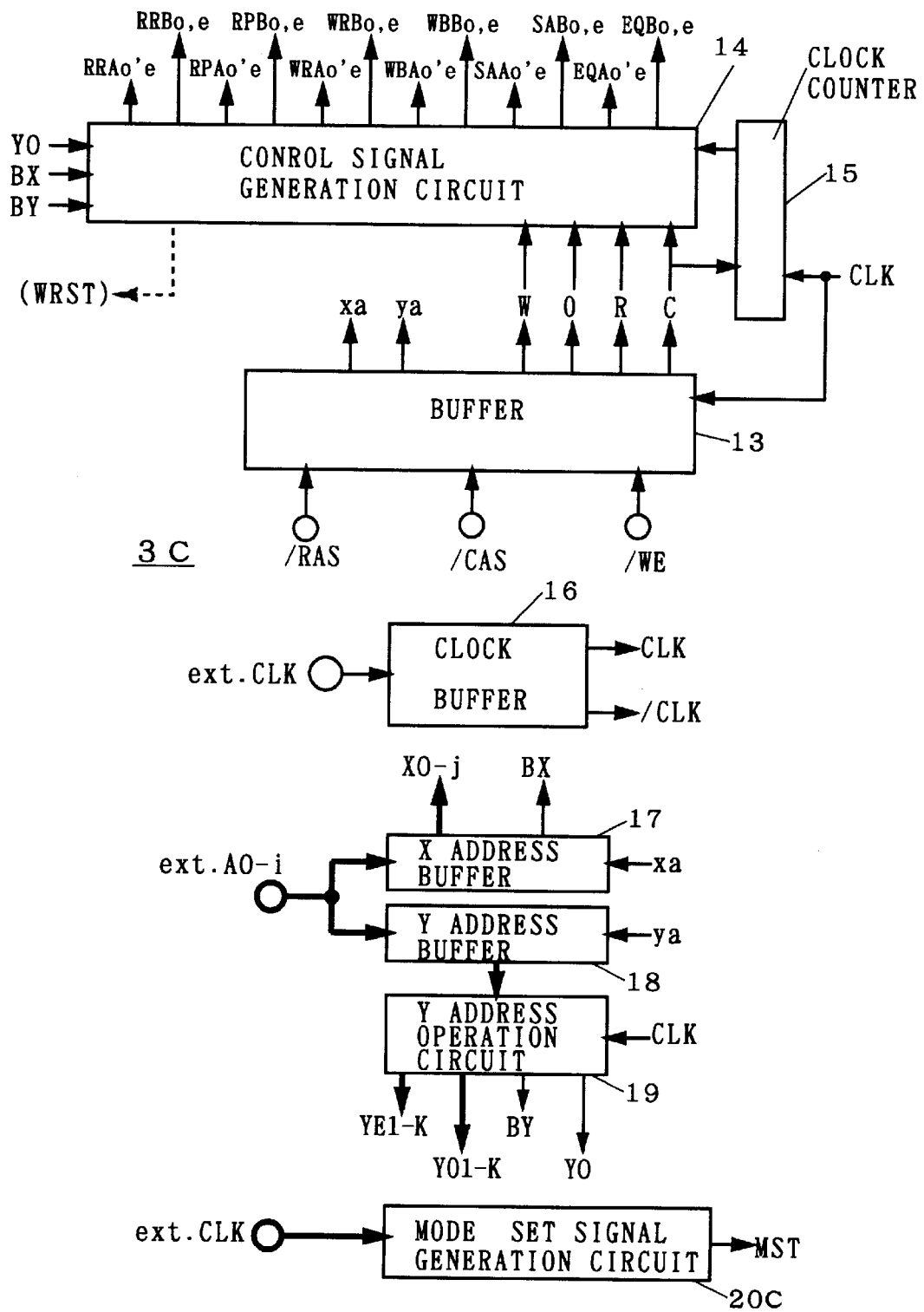
FIG. 25 is a block diagram showing an internal controller according to a fourth embodiment of the present invention.

FIG. 25 is a block diagram showing an internal controller 3C in an SDRAM device according to this embodiment. The feature of this embodiment resides in the structure of a mode set signal generation circuit 20C. The remaining structures are identical to the respective parts in the corresponding figures with reference to the first or second embodiment.

Figure 26:
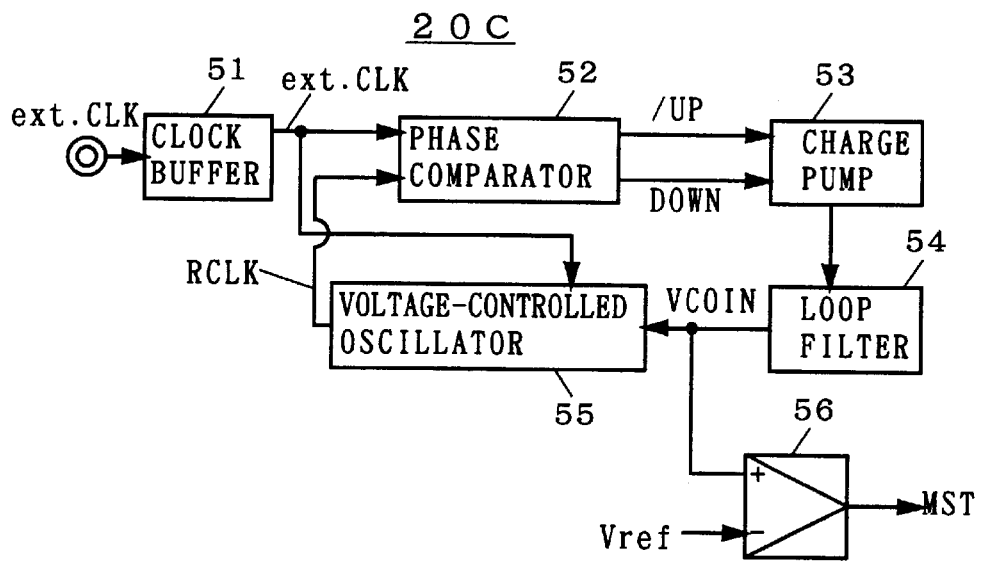
FIG. 26 is a block diagram of a circuit for monitoring an external clock signal and generating a mode set signal.

FIG. 26 is a block diagram of the circuit 20C for monitoring an external clock signal ext.CLK and generating a mode set signal MST. This circuit 20C is formed by a clock buffer 51, a phase comparator 52, a charge pump 53, a loop filter 54, a voltage-controlled oscillator 55, and a differential amplifier 56. Symbol Vref denotes an intermediate potential. The phase comparator 52 compares the phase of the external clock signal ext.CLK with that of a clock signal RCLK generated in the internal voltage-controlled oscillator 55 shown in FIG. 25, for increasing an activation time for a first output signal /UP if the former leads the latter, while increasing the activation time for a second output signal DOWN beyond that for the first output signal /UP if the latter leads the former. The charge pump 53 converts the ratio between these signals /UP and DOWN to a voltage. The charge pump 53 operates in a direction for setting its output voltage high if the activation time for the first output signal /UP is longer than that for the second output signal DOWN, otherwise operating in a direction for setting its output voltage low. An output from the charge pump 53 is converted to a stable voltage through the loop filter 54, and its signal VCOIN is inputted in the voltage-controlled oscillator 55. The voltage-controlled oscillator 55 changes its oscillation frequency by the supplied voltage VCOIN. This oscillator 55 increases its oscillation frequency as the inputted voltage VCOIN is increased. The differential amplifier 56 compares the voltage VCOIN supplied to the voltage-controlled oscillator 55 with the intermediate potential Vref, and outputs the result of this comparison as the mode set signal MST. This mode set signal MST controls a write operation in a memory part, similarly to the first and second embodiments. The differential amplifier 56 sets the mode set signal MST at a high level when VCOIN>Vref, thereby setting a write period to be longer by one cycle of an external clock (in case of the system 2.) or a specific delay time (in case of the system 1.).

Figure 27:
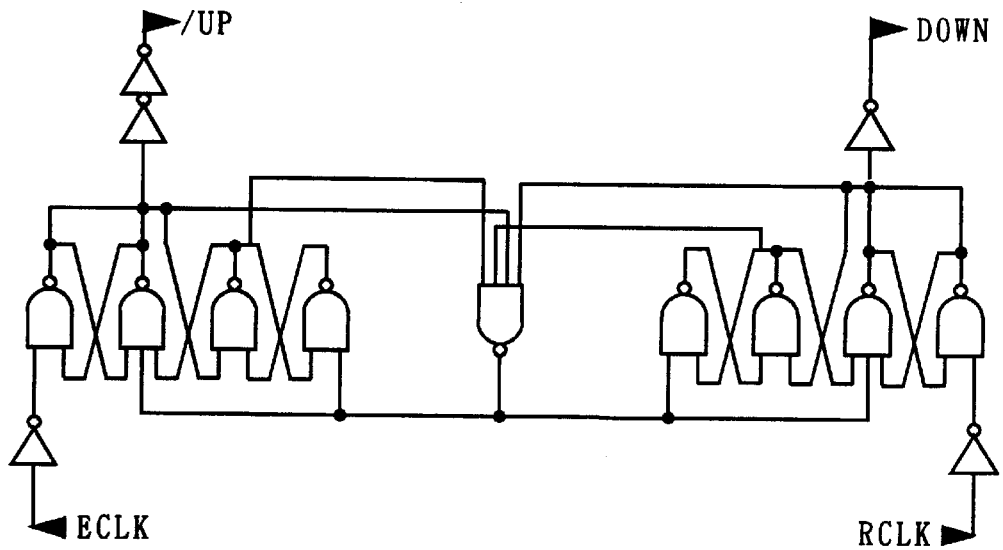
FIG. 27 illustrates the structure of a phase comparator.
Figure 28:
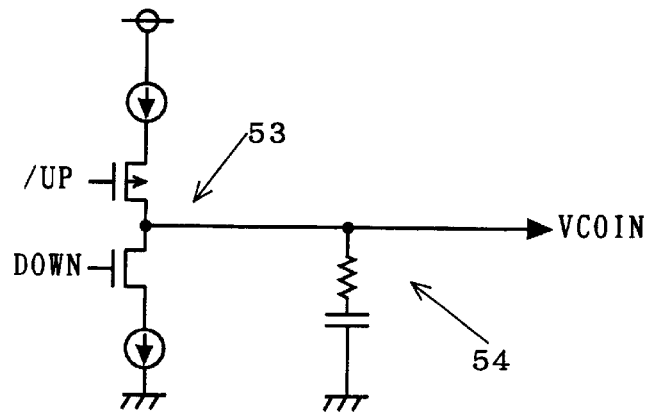
FIG. 28 illustrates the structures of a charge pump and a loop filter respectively.
Figure 29:
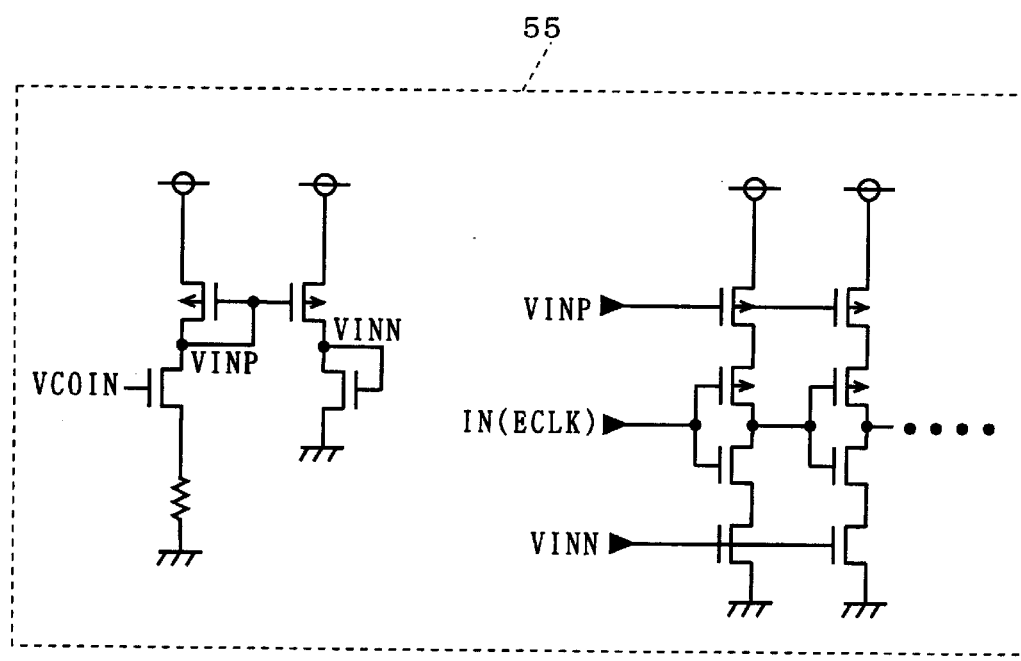
FIG. 29 illustrates the structure of a voltage-controlled oscillator.

FIGS. 27, 28 and 29 show the respective components shown in FIG. 26. FIGS. 27, 28 and 29 show an exemplary phase comparator 52, an exemplary charge pump 53 and an exemplary loop filter 54, and an exemplary voltage-controlled oscillator 55 respectively.

As hereinabove described, it is possible to attain an effect similar to those of the first and second embodiments, i.e., such an effect that the write margin can be ensured also when the operating frequency is increased, also by monitoring the frequency of the external clock signal and changing the write timing when the same exceeds a predetermined frequency (corresponding to the intermediate potential Vref in terms of voltages).

While the invention has been shown and described in detail, the foregoing description is in all aspects illustrative and not restrictive. It is therefore understood that numerous modifications and variations can be devised without departing from the scope of the invention.

We claim:

1. A synchronous semiconductor memory device comprising:

storage means for continuously writing data of several bits being inputted from an exterior in synchronization with a clock signal every predetermined bit number and continuously reading said data in synchronization with said clock signal every said predetermined bit number; and control means for increasing a write period for said data by a predetermined time in response to increase of an operating frequency being the frequency of said clock signal within the range of a latency thereby controlling write and read operations for said data, said latency corresponding to the cycle number of said clock signal up to reading of first-bit data among said data after a read command is inputted from said exterior.

2. The synchronous semiconductor memory device in accordance with claim 1, wherein said clock signal is an external clock signal being inputted from said exterior, and said control means comprises:

mode set means for detecting change of a period corresponding to said latency to a mode being longer than a predetermined value on the basis of an address signal being inputted from said exterior and outputting a mode set signal, and write period control means for increasing said write period in response to said mode set signal.

3. The synchronous semiconductor memory device in accordance with claim 2, wherein said write period control means comprises:

write operation ending delay means for delaying ending of said write operation for said data by a specific time only when said mode set signal provides said change to said mode, and said specific time is decided on the basis of the minimum time being necessary for writing said data.

4. The synchronous semiconductor memory device in accordance with claim 2, wherein said write period control means comprises:

write operation delay means for delaying both starting and ending of said write operation for said data by a time corresponding to one clock cycle of said external clock signal only when said mode set signal provides said change to said mode.

5. The synchronous semiconductor memory device in accordance with claim 4, wherein said storage means comprises:

memory array banks of a number corresponding to said predetermined bit number, a write driver being provided for each of said memory array banks and connected to said memory array banks through an input/output signal line, so that its operation is controlled by said control means, and a write register being provided for each of said memory array banks and connected to a data input line inputting said data from said exterior and said write driver, so that its operation is controlled by said control means, and said write period control means comprises:

write driver control signal generation means for generating a write driver control signal starting said write operation in response to a write command being inputted from said exterior and ending said write operation in response to a lapse of clock cycles of said external clock signal corresponding to said predetermined bit number and outputting the same to said write driver when said mode set signal is at a level not instructing said mode change, while delaying said write driver control signal by said time corresponding to said one clock cycle of said external clock signal thereby outputting a delayed signal when said mode set signal is at a level instructing said mode change.

6. The synchronous semiconductor memory device in accordance with claim 1, wherein said control means comprises:

internal clock signal generation means for generating an internal clock signal corresponding to a double signal of an external clock signal being inputted from said exterior as said clock signal in response to the level of a mode selection signal being inputted from said exterior, and write period control means for increasing said write period in response to the time when said internal clock signal is generated.

7. The synchronous semiconductor memory device in accordance with claim 6, wherein said control means further comprises:

mode set means for detecting change of a period corresponding to said latency to a mode being longer than a predetermined value on the basis of an address signal being inputted from said exterior and outputting a mode set signal, and said write period control means receives said internal clock signal and increases said write period in response to said mode set signal.

8. The synchronous semiconductor memory device in accordance with claim 7, wherein said write period control means comprises:

write operation ending delay means for delaying ending of said write operation for said data by a specific time only when said mode set signal provides said change to said mode, and said specific time is decided on the basis of the minimum time being necessary for writing said data.

9. The synchronous semiconductor memory device in accordance with claim 7, wherein said write period control means comprises:

write operation delay means for delaying both starting and ending of said write operation for said data by a time corresponding to one clock cycle of said internal clock signal only when said mode set signal provides said change to said mode.

10. The synchronous semiconductor memory device in accordance with claim 9, wherein said storage means comprises:

memory array banks of a number corresponding to said predetermined bit number, a write driver being provided for each of said memory array banks and connected to said memory array banks through an input/output signal line so that its operation is controlled by said control means, and a write register being provided for each of said memory array banks and connected to a data input line inputting said data from said exterior and said write driver so that its operation is controlled by said control means, and said write period control means comprises:

write driver control signal generation means for generating a write driver control signal starting said write operation in response to a write command being inputted from said exterior and ending said write operation in response to a lapse of clock cycles of said internal clock signal corresponding to said predetermined bit number and outputting the same to said write driver when said mode set signal is at a level not instructing said mode change, while delaying said write driver control signal by said time corresponding to said one clock cycle of said internal clock signal and outputting delayed said signal when said mode set signal is at a level instructing said mode change.

11. The synchronous semiconductor memory device in accordance with claim 1, wherein said clock signal is an external clock signal being inputted from said exterior, and said control means comprises:

external clock signal monitor means for monitoring said external clock signal and outputting a mode set signal when the frequency of said external clock signal is higher than a predetermined frequency, and write period control means for increasing said write period in response to the time when said mode set signal is outputted.

12. The synchronous semiconductor memory device in accordance with claim 11, wherein said write period control means comprises:

write operation ending delay means for delaying ending of said write operation for said data by a specific time only when said mode set signal provides said change to said mode, and said specific time is decided on the basis of the minimum time being necessary for writing said data.

13. The synchronous semiconductor memory device in accordance with claim 11, wherein said write period control means comprises:

write operation delay means for delaying both starting and ending of said write operation for said data by a time corresponding to one clock cycle of said external clock signal only when said mode set signal provides said change to said mode.

14. A synchronous semiconductor memory device continuously writing data of several bits being inputted from an exterior in synchronization with an external clock signal every predetermined bit number and writing said data in synchronization with said external clock signal every said predetermined bit number, said synchronous semiconductor memory device comprising:

a storage portion for writing said data and reading said data; and a write operation ending control circuit for delaying ending of an operation for writing said predetermined bit-numbered data in said storage portion by a predetermined time when a latency corresponding to the cycle number of said external clock signal up to reading of first-bit data among said data is set at a second latency being longer than a first latency after a read command is inputted from said exterior.

15. A synchronous semiconductor memory device continuously writing data of several bits being inputted from an exterior in synchronization with an external clock signal every predetermined bit number and writing said data in synchronization with said external clock signal every said predetermined bit number, said synchronous semiconductor memory device comprising:

a storage portion for writing said data and reading said data; and a control circuit for writing said data in said storage portion in a second write period being longer than a first write period for said data, said first write period being necessary when said clock signal corresponds to an external clock signal being inputted from an exterior, when said clock signal corresponds to a double clock signal of said external clock signal.

* * * * *